US 6,729,541 B1

(12) United States Patent
Kurokawa et al.

(10) Patent No.: US 6,729,541 B1
(45) Date of Patent: May 4, 2004

(54) INFORMATION READING APPARATUS AND INFORMATION RECORDING MEDIUM

(75) Inventors: Yoshiaki Kurokawa, Chiba (JP);
Toshifumi Ohkubo, Tokyo (JP);
Manabu Yamamoto, Sayama (JP);
Takaya Tanabe, Tokorozawa (JP);
Shogo Yagi, Mito (JP)

(73) Assignee: Nippon Telegraph & Telephone Corporation, Tokyo (JP)

( * ) Notice: Subject to any disclaimer, the term of this patent is extended or adjusted under 35 U.S.C. 154(b) by 0 days.

(21) Appl. No.: 09/340,718

(22) Filed: Jun. 29, 1999

(30) Foreign Application Priority Data

| Jul. 1, 1998 | (JP) | 10-185883 |
| Jul. 1, 1998 | (JP) | 10-186476 |
| Jul. 1, 1998 | (JP) | 10-186485 |
| Aug. 26, 1998 | (JP) | 10-240398 |

(51) Int. Cl.$^7$ .................................................. G06K 7/14
(52) U.S. Cl. .................. 235/454; 235/375; 235/457; 235/462.34; 369/112.09; 369/112.1; 369/112.27
(58) Field of Search .................................. 235/375, 454, 235/457, 462.34; 369/112.09, 112.1, 112.27; 385/129–132

(56) References Cited

U.S. PATENT DOCUMENTS

| 4,400,616 A | | 8/1983 | Chevillat et al. | |
| 4,548,463 A | * | 10/1985 | Cato et al. | 235/457 |
| 5,214,633 A | | 5/1993 | Tanno et al. | |
| 5,218,594 A | * | 6/1993 | Tanno | 369/111 |
| 5,235,661 A | * | 8/1993 | Kawai | 385/129 |
| 5,465,311 A | * | 11/1995 | Caulfield et al. | 385/27 |
| 5,471,548 A | | 11/1995 | Brazas | |
| 5,724,164 A | | 3/1998 | Lowenhar et al. | |
| 5,740,145 A | * | 4/1998 | Jacobowitz et al. | 369/103 |
| 5,761,181 A | | 6/1998 | Nunnally | |
| 5,784,352 A | * | 7/1998 | Swanson et al. | 369/94 |
| 5,966,361 A | * | 10/1999 | Stoll | 369/103 |

FOREIGN PATENT DOCUMENTS

| JP | 6-18811 | 1/1994 |
| JP | 6-43510 | 2/1994 |
| JP | 8-124209 | 5/1996 |
| JP | 9-126947 | 5/1997 |
| WO | WO 96/37887 | 11/1996 |

* cited by examiner

Primary Examiner—Michael G. Lee
Assistant Examiner—Ahshik Kim
(74) Attorney, Agent, or Firm—Thelen Reid & Priest LLP

(57) ABSTRACT

An information reading apparatus can detect the coupling state of the input light to a waveguide of a laminated recording medium in a simple manner, so as to enable to focus the input light on a target recording layer to access the information recorded in the target recording layer quickly. The apparatus is compact and is economical to produce. The apparatus has a light source for injecting a light on an input edge of a lamination recording section, assembled into the recording medium containing a lamination of recording layers. Each recording layer has data represented by scattering centers which diffract an input light generated by a converging lens. An input light directing device directs the light source and the converging lens as a unit to focus the input light on a desired location. An image recording device records an informational image generated by guided waves produced within a laminated waveguide. An optical power detector detects output light emitted from an output edge of a specific recording layer as well as scattered light generated from recording layers other than the specific recording layer. An optical power discrimination circuit determines whether an optical power detected by the optical power detector is associated with the output light or the scattered light. Data recorded in any specific recording layer can be accessed quickly and simply by focusing input light on a core layer of a multi-layered hologram recording data storage medium. Because the absolute positional information stored in the storage medium is minimized, data storage capacity of the storage medium is almost unaffected while making the apparatus compact and low cost.

21 Claims, 23 Drawing Sheets

Prior Art

Prior Art

Prior Art

INFORMATION READING APPARATUS AND INFORMATION RECORDING MEDIUM

BACKGROUND OF THE INVENTION

1. Field of the Invention

The present invention relates to information technologies, and relates in particular to an apparatus for quickly accessing information stored in any specific recording layer in an ultra-high capacity storage device based on laminated holograms, a recording medium for information storage and a method of accessing the information and an illumination head for use in such a recording apparatus.

2. Description of the Related Art

There has been a growing need for compact, high capacity memory devices to meet the demands of mobile computing devices and other similar data storage devices. The simplest card type memory device currently in use is a magnetic stripe bonded to a card base, but because of its inherent small memory capacity, they are only useful in a limited number of applications.

FIG. 23 shows an example of the card type IC memory device ε having a higher memory capacity than the magnetic card. Such a device ε is comprised by embedding a memory element, such as ROM and flash ROM, in an IC card medium 23, and is supported by a card guide 24 provided on a data accessing device. Data are read from or written in the memory element by contacting a read/write electrode 25 with a read/write head 26 provided on the accessing apparatus.

However, in the case of the conventional IC cards, although the memory capacity is higher than the magnetic cards, it is still insufficient to meet the future requirements for increasing the memory sizes to several hundred megabits to several gigabits. Costs of bits in such devices are also high and, therefore, they are not suitable as practical future high capacity memory devices.

FIG. 24 shows another example of a similar IC card 101 to be processed by a reading apparatus comprised by a read head 102, electrodes for read or write functions, and guide rollers 104 for positioning the IC card 101. Compared with the magnetic cards, their memory capacity is much higher but is still insufficient to meet the needs of mega to giga range of bit memory capacity. This device is also not suitable for future high capacity memory device because of the high costs for making a three-dimensional architecture required for uses in multilayer devices and information input/output circuits.

It has been suggested that higher memory capacities can be realized by using holograms to record information. Hologram recording is anticipated to be a likely future medium for software distribution because of the low unit cost of bits as well as the difficulty of counterfeiting. In particular, planar hologram ROMs can be mass-produced using a printing technology, and a further increase in the density of recording volume is possible through the use of a holographic card in which a planar hologram is embedded in a waveguide and the data are replicated from one specified layer using waveguided light as reference light (refer to a Japanese Patent Application, Second Publication, Hei 10-32578).

In the holographic data storage method, a multi-layered waveguide recording medium is produced by alternating a core layer and a clad layer, and information is recorded as scattering centers in each waveguide layer. Desired information can be reproduced by coupling an input light with a target waveguide layer to reproduce only the desired hologram image. This technology presents a distinct feature that the card medium can be structured such that other waveguide layers are prevented from coupling, thereby suppressing the chances of cross talk.

FIG. 25 shows an example of a candidate for the high capacity holographic memory card 105, containing multi-layered ROM devices of ten to several tens of micrometers interlayer spacing The card type recording medium 105 includes a plurality of recording layers 106, each layer having a wedge-shaped hologram (ROM) to be read as a hologram image H out of the layer (actually, on both surfaces of the layer) when an illumination light is injected from a wedge tip 106a. The hologram image can be read at highspeed by a solid-state recording device 107.

The information recording card 105 can be manufactured by a relatively simple process of laminating the hologram recording layers 106, resulting in increasing the thickness of the data storage section and the memory capacity.

However, it is necessary for this recording card 105 to be able to produce a hologram image from a specific layer of the laminated structure, by focusing the beam L precisely at a definable hologram layer of the card medium, so as to propagate and scatter the input light within that layer only to produce the desired hologram image H while avoiding a cross talk between the layers.

For this purpose, the beam spot La of the light beam L is not only required to focus on the light injection end 106a (base of the wedge) but also to move on one axis in the thickness direction of the card medium 105, as well as to be able to move in the x and y directions as shown in FIG. 25. As illustrated in FIG. 25, the card medium 105 is scanned in the x, y directions quickly and smoothly by a beam spot La, generated from a light source 108, to focus the light through a lens 100 of an optical system 109 on the specific layer of the multilayer card medium 105.

FIG. 26 shows another example of the IC card. This IC card 201 is similar to the IC card 101 shown in FIG. 24, and it is still insufficient to hold data in the range of several hundred mega bits to giga bits, and considering the difficulty of producing a laminated magnetic card in three-dimensions and the high cost of bits, there is little practical potential for this design.

FIG. 27 shows another example of a high-capacity memory medium in the form of a hologram card 203, comprised by a lamination of hologram patterns spaced apart at about several tens of micrometers, recorded in wedge type recording layers 241. Input light is injected from the base of the wedge and a hologram image is produced on both sides of the memory section, and is recorded with a solid state imaging element 205.

The hologram card medium 203 can be made by laminating recording layers, and each recording layer produces a two-dimensional hologram which can be transmitted quickly. In this system also, the beam spot La must be moved in three-dimensions to access data recorded in individual recording layers.

The primary problem in such systems is the precision required in the complex movement of the beam spot La in a three-dimensional space, at sub-micron precision to obtain the required degree of recording density. For this reason, such systems have not been practical for the needs of high speed data transmission.

Although a potential for low cost recording has been indicated by the use of holographic recording technology, some of the important basic needs have not been properly addressed in this technology. For example, it is necessary to couple the light to a specific waveguide layer in order to access data recorded on this specific waveguide layer, but presently, neither the method of simple detection of the coupling state between the input light and the waveguide layer nor the method of targeting the specific waveguide layer has been established. Without having such basic techniques firmly in place, it is not possible to establish high-speed accessing to reproducing the data or to devise a practical compact device at low cost.

The holographic technology is used sometimes to prevent counterfeit card as disclosed in a Japanese Patent Application, First Publication, Hei 7-306630. Counterfeit cards can be identified by checking for a hologram image that contains machine readable information recorded on the card medium as well as a decorative hologram image not containing any hard information. However, conventional hologram cards can only record information on one layer only, so that a high capacity memory requires a large recording area. To increase the memory size, a multi-layered card is necessary, but to use such a laminated holographic card for practical purposes, it is important to be able to accurately access a desired hologram in the laminated holograms, and presently, a technology for focusing a beam of light on definitive positions in such a multi-layered information medium has not been established.

SUMMARY OF THE INVENTION

It is, therefore, a first object of the present invention to provide an information recording medium and an information reading apparatus that can detect the coupling state of the input light to a waveguide in the laminated information recording medium in a simple manner, so as to enable to focus the input light on a target recording layer to access the information recorded in the target recording layer accurately and quickly. The apparatus should also be compact and economical to produce.

A second object of the present invention is to provide: an apparatus for reading and transferring information at high speeds; quick access to information; a high capacity information recording medium for the apparatus; and a method for high-precision aligning of input light to a target recording medium. Manufacturing of the apparatus and the recording medium having an ultra-high data storage capacity should be simple and low cost. Highspeed access to information is enabled by developing a simple method of aligning the illumination head with a target recording layer.

A third object of the present invention is to provide a hologram reading apparatus and a method for high-precision aligning of input light to a specified hologram recording layer efficiently and at low cost while enabling to retain all the advantages of holographic recording of information.

A fourth object of the present invention is to provide: an information recording medium that is capable of ultra-high capacity data storage and reliable outputting of data; an information reading apparatus for reliable reading of information recorded in such a medium; and a method of using the information reading apparatus.

These objects have been achieved by developing a method for reading a target hologram so that the input light can be accurately directed to a target hologram contained in a hologram element comprised by a laminated planar waveguide type recording layers, by detecting the light emitted from the recording layer, judging the results and counting the results, so that data from the target recording layer can be read by directing the input light according to the data in a servo information image and other judging results.

In more specific details, the objects have been achieved in the hierarchical concept embodied in the succeeding apparatuses and methods that are briefly explained.

An apparatus for selectively reading data recorded on an information recording medium formed by laminated recording layers, comprises: a light source for injecting a light on an input edge of a lamination recording section, of a multi-layered planar waveguide type, assembled into the recording medium containing laminated recording layers, each recording layer having data represented by scattering centers; a converging lens for freely adjustably focusing the light emitted from the light source to generate an input light; an input light directing device for directing the light source and the converging lens as a unit so as to focus the input light to a desired location; an image recording device having an imaging element for recording an informational image generated by diffraction effects of guided waves produced within the multi-layered planar waveguide type recording element; an optical power detector for detecting output light emitted from an output edge of a recording layer as well as scattered light generated from layers other than the recording layer; and an optical power discrimination circuit, operatively connected to the input light directing device, for determining whether an optical power detected by the optical power detector is associated with the output light or the scattered light.

The present apparatus enables to access data recorded in any specific recording layer quickly and simply by focusing input light on a core layer of a multi-layered hologram recording card medium.

Because the absolute positional information is minimized, data storage capacity of the card medium is almost unaffected while enabling to make the apparatus compact and low cost.

An apparatus for reading data in an information recording medium containing a plurality of lamination recording sections arranged longitudinally and separated by a plurality of longitudinally extending head seek grooves, is comprised by: an illumination head device having a light output section shaped to freely couple or decouple from a head alignment groove formed at a light input section of each of the lamination recording sections, and to freely slide in a thickness direction of the information recording medium when being coupled with the head alignment groove for aligning with a recording layer; and an image data recording device having an imaging element for recording a floating image formed in a space above the information recording medium generated by output light emitted from the illumination head device interacting with a lamination recording section.

According to the above apparatus, control mechanisms for selecting a target recording layer in the laminated holograms and control sequence are simple but effective, thereby providing an apparatus that can seek/access information quickly at low cost.

Another apparatus for reading data recorded on lamination recording sections, having multi-layered recording layers within each lamination recording section, embedded in a ring shape and held integrally in a data storage disc, is comprised by: optical system means for focusing an input laser light on a light injection window of a target recording layer in the data storage disc; reflected return light detecting means for detecting a returning portion of the input laser light reflected from a lamination section; separator/ comparator means for separating and comparing frequency components contained in photo-electric converted signals produced by the reflected return light detecting means; counting means for counting a number of traverses made by the photo-electric converted signals across a predetermined threshold value; and aligning means operatively connected to the separator/comparator means for aligning the input laser light with the light injection window by moving in an axial direction.

According to the above apparatus, the disc has a ring of lamination recording sections to be read by illumination from inside periphery of the disc attached to the center shaft which is driven by a solid motor, aligning of input light with the light injection window can be performed by a uniaxial movement of the center shaft at right angles to the card medium. This design facilitates access to the target recording layer at low cost.

Another apparatus for reading information recorded on a target waveguide by injecting an input light into a lamination recording section comprised by a plurality of waveguides serving as information recording layers in an information recording medium is comprised by: an extreme layer detection device for determining positions of a front waveguide and a rear waveguide in the lamination recording section; a layer edge detection device for determining positions of a front waveguide edge and a rear waveguide edge; and a layer position determining device for determining positions of each waveguide and a slanted surface associated with each waveguide edge, according to positions of the front waveguide and the rear waveguide obtained by the extreme layer detection device and positions of the front waveguide edge and the rear waveguide edge obtained by the layer edge detection device.

According to the above apparatus, the positions of the recording layers in the lamination recording section can be obtained from the positions of the front and rear recording layers and the input edges of the waveguides. Therefore, the apparatus can provide data in the target waveguide quickly and reliably by a few simple steps of identifying the positions of waveguides and slanted input edges from a lamination recording section containing many waveguides.

Also, according to the above apparatus, horizontal position of input edges of all the waveguides for focusing input light can be detected reliably so that fluctuations in the waveguide position can be accommodated without the loss of precision even when the number of waveguides is increased.

An information recording medium is structured as a card medium having card framing to contain not less than one longitudinally extending lamination recording section comprised by planar waveguide type information recording layers laminated in a thickness direction of the card medium and a row of head alignment grooves having respective light injection windows separated by a head seek groove extending longitudinally so as to permit an illumination head to freely travel in the head seek groove to couple with a desired light injection window.

According to the above information recording medium, a basic section is a lamination recording section produced by vertically piling a plurality of planar waveguide type recording layers containing holograms (ROM layers). Therefore, only the light injection windows need to be fabricated precisely in the form of head aligning v-notches. These notches can be fabricated all at once, after laminating the recording layers, so that ultra-high capacity memory device can be mass produced at low cost, thereby presenting a significant advance in the state of the art of memory devices.

Another information recording medium is comprised by a data storage disc section having recording sections comprised by a lamination of recording layers distributed in a ring shape and a support section for supporting the data storage disc section at its periphery.

According to the above recording medium, a desired number of recording layers are piled successively and the assembly is fabricated together into a data storage disc, so that the ultra-high capacity memory medium can be manufactured easily at low cost, thereby presenting a significant advance in the state of the art of memory devices.

Another information recording medium is comprised by a lamination of a plurality of waveguides serving as recording layers, and containing markers indicating a position of a light injection window corresponding at least to a front recording layer and a rear recording layer.

According to the above recording medium, the position markers for the front and rear recording layers enable input light positions in three-dimensions to be identified readily so that precision alignment can be performed quickly.

A method for selectively reading data recorded in a lamination recording section comprised by planar waveguide type recording layers by identifying a target recording layer by moving input light across input edges and detecting optical power of output light emitted from output edges to identify the target recording layer and obtaining an informational image to read target data contained in the target recording layer.

This is the basic conceptual approach to the method of reading hologram information. More detailed methods for selecting a target recording layer are described in the following.

A detailed method for selectively reading data from a target recording layer included in a lamination recording section having planar waveguide type recording layers, comprises the steps of:

focusing a light emitted from a light source to form an input light for injecting into an input edge of any of the recording layers including the target recording layer; focusing light on a front recording layer or a rear recording layer serving as references for determining positions of recording layers; focusing light on the target recording layer and detecting an optical power level received on optical power discriminating means; judging whether the optical power level corresponds to output light emitted from an output edge of any one of recording layers or to scattered light produced from layers other than the recording layers while moving the input light across input edges to identify the target recording layer; focusing the light on an input edge of the target recording layer in final positioning to generate an informational image; and recording the an informational image so as to read data contained in the target recording layer.

Another detailed method for selectively reading data from a target recording layer included in a lamination recording section having planar waveguide type recording layers, comprises the steps of:

focusing a light emitted from a light source to form an input light for injecting into an input edge of any of the recording layers including the target recording layer; judging whether the optical power level corresponds to output light emitted from an output edge of any one of recording layers or to scattered light produced from layers other than recording layers, so that, when output light is detected, recording an informational image produced by that recording layer as positioning reference for other recording layers, and, when scattered light is detected, the input light is re-focused to any neighboring recording layer and recording an informational image produced from the neighboring recording layer to obtain data from the neighboring recording layer as positioning reference for recording layers; identifying position of the target recording layer while moving the input light across input edges and judging optical power levels; and transferring the input light to an input edge of the target recording layer, and recording an informational image generated to read data contained in the target recording layer.

According to these detailed methods, selection of a core layer for obtaining hologram data recorded in the core layer can be performed quickly and easily because any target recording layer can be identified by following a simple process of preliminary determination of layer positions followed by precision input alignment with the injection widows of respective target recording layer.

Another detailed method for aligning an illumination head for reading information recorded in a laminated information recording medium, having a plurality of data recording layers laminated in a thickness direction of the card medium, comprised by a plurality of lamination recording sections arranged in a longitudinal direction, wherein each lamination recording section has a head alignment groove at a transverse end for coupling with an illumination head having light injection windows for aligning the illumination head with a specific recording layer by sliding in a card thickness direction within the head alignment groove, and rows of lamination recording sections are separated by longitudinal head seek grooves; the method comprises the steps of:

detecting head positioning markers provided on a longitudinal frame of the card medium to correspond to head alignment grooves; decoupling an illumination head from a head alignment groove and placing in a standby position, and moving the illumination head along a head seek groove to oppose a selected head positioning marker for preliminary head positioning; positioning the illumination head to a top or bottom window position within the head alignment groove, and coupling to the head alignment groove in a vertical position; performing rough positioning of the illumination head so that input light is roughly in line with a target light injection window; and performing precision positioning of the illumination head so that input light is precisely aligned with the target light injection window.

Another method for aligning an illumination head for reading information contained in an information recording medium comprised by a data storage disc section having lamination recording sections distributed in a ring arrangement, is performed by initial alignment based on power levels of reflected return light produced by a portion of input light from a vicinity of input light window of the target recording layer.

Another method for reading data, recorded in laminated information recording medium having a plurality of waveguides as information recording layers, comprises the steps of: detecting positions of a front waveguide and a rear waveguide as well as input edges associated with each waveguide; determining positions of each waveguide as well as the input edges according to positions of the front waveguide and the rear waveguide as well as slanted edge surfaces associated with the input edges; and focusing light on an input light position determined by a position of a target waveguide and a position of a slanted edge surface associated with the target waveguide so as to read data contained in the target waveguide included in the plurality of waveguides.

Another method for aligning an illumination head for reading information recorded in a laminated information recording medium by coupling with an illumination head; the method comprising the steps of:

detecting head positioning markers provided on a longitudinal frame of the card medium to correspond to head alignment grooves; decoupling an illumination head from a head alignment groove and placing in a standby position, and moving the illumination head along a head seek groove to oppose a selected head positioning marker for preliminary head positioning; positioning the illumination head to a top or bottom window position within the head alignment groove, and coupling to the head alignment groove in a vertical position; performing rough positioning of the illumination head so that input light is roughly in line with a target light injection window; and performing precision positioning of the illumination head so that input light is precisely aligned with the target light injection window.

Another method for reading data, recorded in laminated information recording medium having a plurality of waveguides as information recording layers, comprises the steps of:

providing positioning markers to correspond with positions of light injection windows associated with a front waveguide and a rear waveguide; detecting light input positions for inputting light into the front waveguide and the rear waveguide with reference to respective markers; obtaining light input positions to each waveguide in the plurality of waveguides according to detected light input positions of the uppermost waveguide and the lowermost waveguide; and focusing light on an input light position determined by a position of a target waveguide so as to read data contained in the target waveguide included in the plurality of waveguides.

DESCRIPTION OF THE PREFERRED EMBODIMENTS

Preferred embodiments of the various reading apparatuses for reading the multi-layered holograms, method of reading multi-layered holographic data, and a laminated card storage medium will be presented in the following with reference to FIGS. 1 to 22.

Embodiment 1

Embodiment 1 presents examples of the selective hologram reading apparatus (Apparatus 1 to 4) for reading a selected layer in a multi-layered hologram element, and corresponding methods Method 1 to 4) for using the apparatuses.

Apparatus 1

Figure 1:
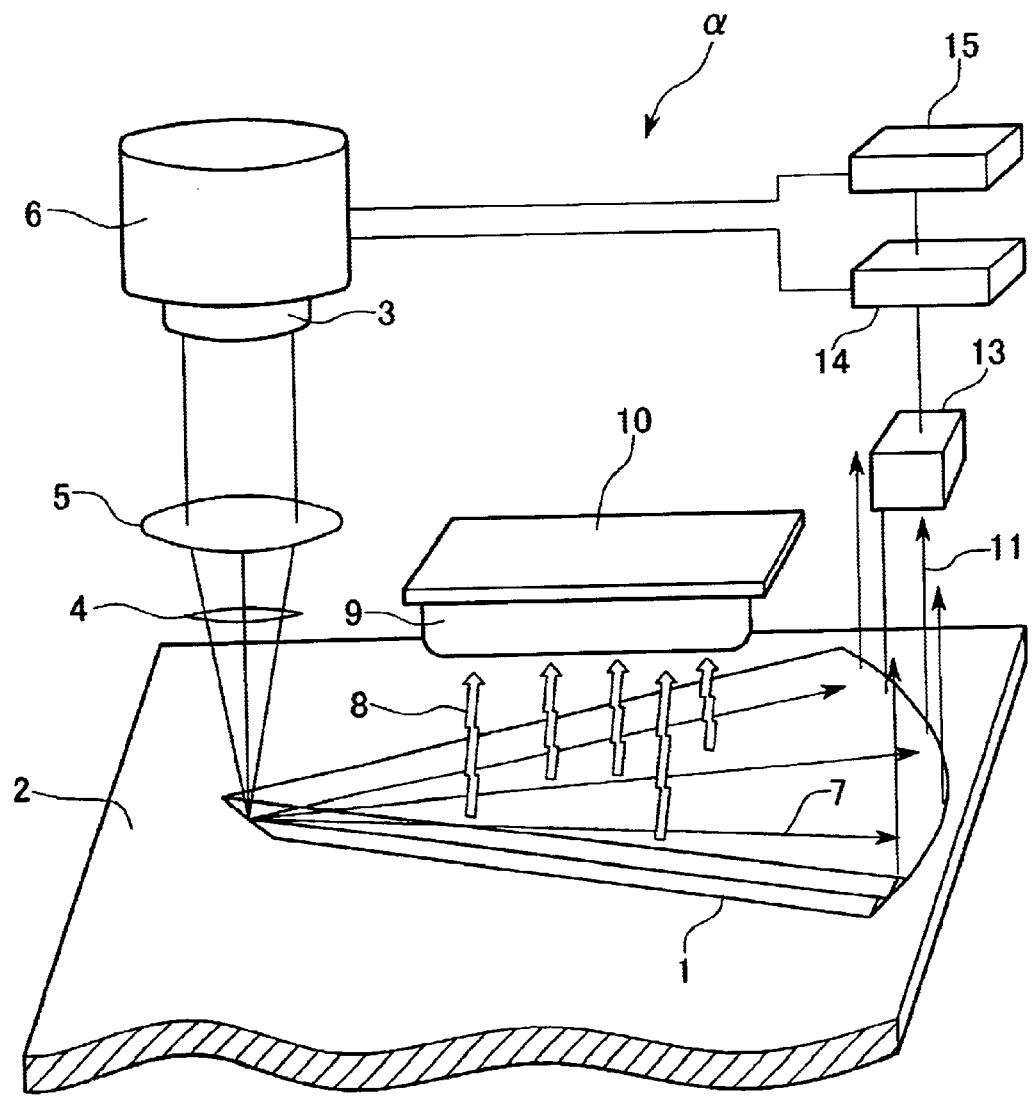
FIG. 1 is a perspective view of Apparatus 1 of the selective hologram reading apparatus in Embodiment 1.
Figure 2A:
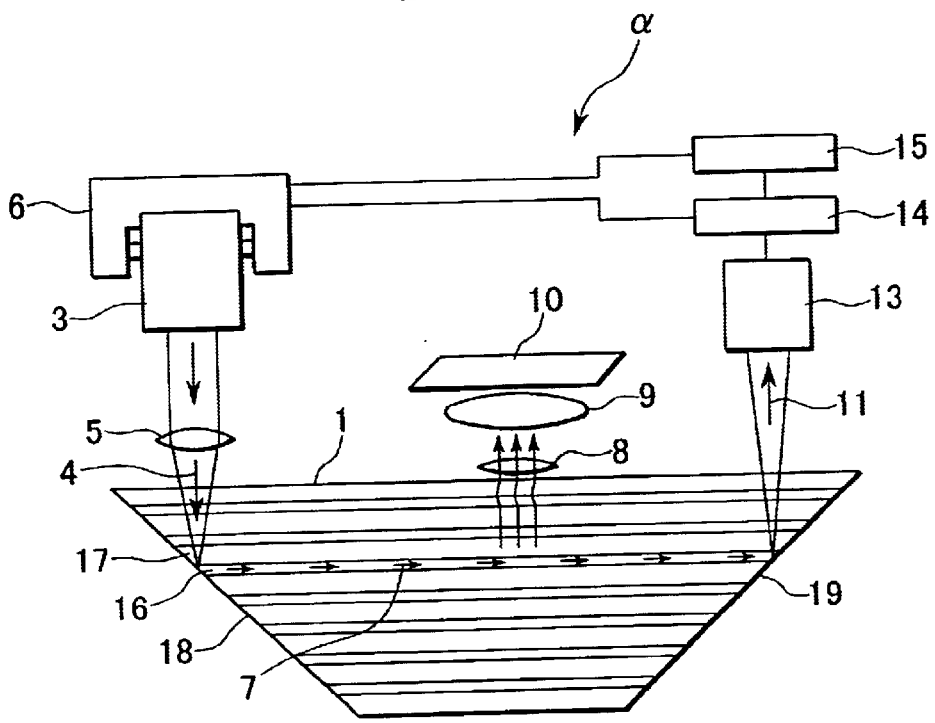
FIGS. 2A, 2B are, respectively, cross sectional views of Apparatus 1 of the selective hologram reading apparatus and an illustration of the scattered light in the waveguides of Apparatus 1.
Figure 2B:
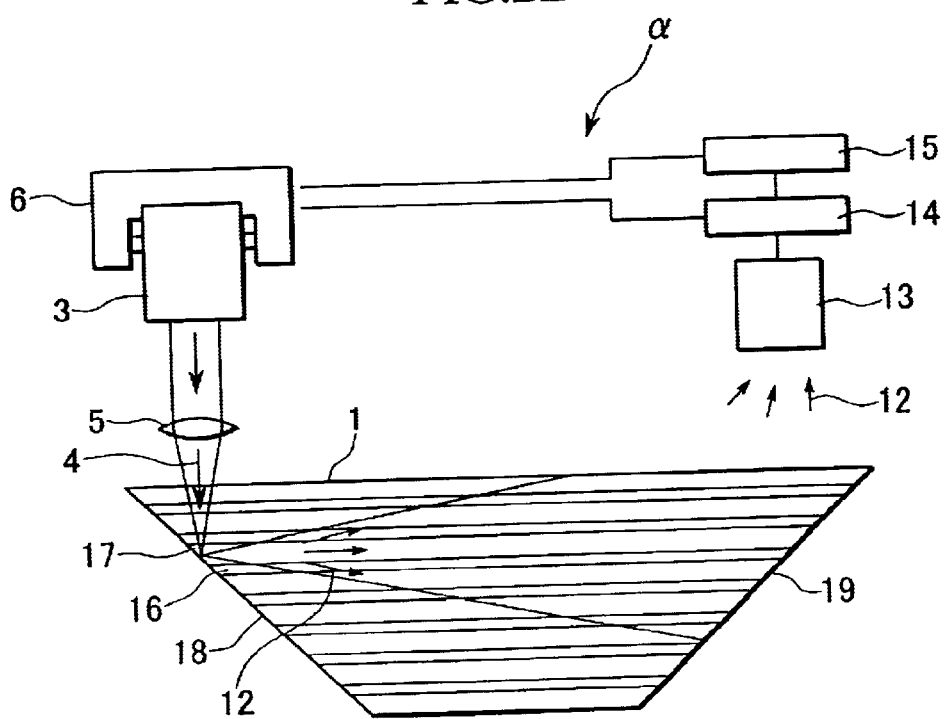

FIGS. 1 and 2 related to the first example of the selective hologram reading apparatus. FIG. 1 is a schematic drawing of the apparatus α, FIG. 2A is a schematic cross sectional view of the apparatus and FIG. 2B is an illustration of the scattered light produced in the hologram reading apparatus.

The apparatus α is comprised by: a laminated waveguide type hologram element 1 comprised by a plurality of recording layers containing scattering factor for producing a hologram image by the light propagating in a waveguide; a card medium 2 to contain the hologram element 1; an imaging light source 3 for emitting a light beam, such as a laser beam, to inject a vertical incident beam at right angle to the hologram element 1; a converging lens 5 to freely focus the beam from the light source 3 on the element 1; an input light directing device 6 having a piezo-electric device and others for positioning the incident beam 4 by moving the light source 3 and the converging lens 5 as a unit; and a hologram image recording device 10 to capture a hologram image 9 generated by diffracted beams 8 output from the guided waves 7 propagating in the hologram element 1.

Ancillary devices include: an optical power detector 13 for detecting the optical power of output light 11 transmitted at right angles from the surface of the hologram element 1 and scattered light 12 output from regions other than the recording layer; an optical power discrimination circuit 14 for differentiating the output light 11 from the scattered light 12, which are detected by the power detector 13; and a counter 15 for producing a total count of the results output from the power discrimination circuit 14. The power discrimination circuit 14 and the counter 15 are electrically connected to the input light directing device 6.

A hologram element 1 is comprised by: a lamination of a core layer 16 alternating with a clad layer 17, where the core layer 16 is a recording layer for propagating the input light 4 as guided waves 7 and a clad layer 17 is an outer layer for scattering the input light 4 as scattered light 12; a slanted reflection surface 18 for reflecting the input light 4 at the input edge to couple to the core layer 16; and an output light reflection surface 19 for directing the reflected output light 11 at the output end. It should be noted that although the recording medium is exemplified by a card type medium 2, other forms of the information storage type can easily be adopted as a recording medium.

It should also be noted that other designs for the selective hologram reading α may include an optical fiber so that the light source 3 is fixed but it is connected to the converging lens 5 through the optical fibers and the lens 5 and the fibers are moved as a unit.

Method 1

Method 1 is applicable to apparatus 1, and will be explained with reference to FIGS. 1 and 2.

A laser beam is generated from the light source 3, and is input in the converging lens 5 as input light 4 which is radiated at right angles to the layer surface of the hologram element 1 to focus on the slanted reflection surface 18.

As shown in FIG. 2A, when the input light 4 is reflected at the slanted reflection surface 18 associated with the core layer 16, the input light 4 is coupled by the input edge of the core layer 16 to become guided waves 7, a part of which becomes diffracted light 8 by being diffracted by the scattering factor (data) of the hologram element 1 at right angles to the layer surface of the hologram element 1 to generate a hologram image 9 as a floating image, and the hologram image reading device 10 reads the image data. The guided waves 7 that were not diffracted propagate through the core layer 16 to the output edge of the output light reflection surface 19 to be emitted as output light 11 at right angles to the hologram element 1.

As shown in FIG. 2B, when the input light 4 is reflected at the slanted reflection surface 18 associated with the clad layer 17, the input light 4 is scattered to become scattered light 12, depending on the degree of aperture opening of the lens 5.

The power of the light emitted from the hologram element 1 is measured by the optical power detector 13. The power level for output light 11 is high while the power level for the scattered light 12 is low. The optical power discrimination circuit 14 compares the measured light power with a predetermined threshold value to judge whether the light being detected is a part of output light 11 reflected from the output edge of the core layer 16 or the scattered light 12 scattered from the clad layer 17, and outputs the judging results to the input light directing device 6.

When the judging results indicate output light 11, the hologram image recording device 10 is used to obtain imaging data by recording the hologram image 9, and when the judging results indicate scattered light 12, the input light directing device 6 is operated to move the input light 4 in such a way that the lens focus which is currently coupled to the input end of the clad layer 17 will be changed to focus on the input end of the core layer 16 so as to couple to the input edge of the core layer 16.

Further, if the input light 4 is seriously out of focus, it may couple with the input edges of several core layers 16, and may cause confusion in deciding the light type. But in such a case, a proper judgment can be exercised by selecting a suitable threshold value of optical power to judge whether the detected light is output light 11 from the core layer 16 or scattered light 12 from the clad layer 17, because the input light 4 is scattered also by the slanted reflection surface 18 associated with the alternating input edges of the clad layers 17, which are surrounded by the core layers 16 coupled to the input light 4. The input light directing device 6 is operated to alter the focus so that the focal point of the input light 4 currently focusing on the clad layer 17 will be altered to focus on one core layer 16 to couple with the input light 4 so as to form hologram data recorded on that layer.

The counter 15 generates a total count of traverses made by the power levels output from the optical power detector 13 across the threshold value, and outputs the result to the input light directing device 6. When apparatus ε is operated so that focal point of the input light 4 moves along the slanted reflection surface 18 associated with all the layers, the detector 13 alternatingly observes the optical power output form the core layer 16 and clad layer 17, because of the periodic structure of the hologram element 1. Therefore, by noting the results of the optical power discrimination circuit 14 and the count from the counter 15, a relative movement of the device 6 with respect to a reference core layer 16 can be determined with accuracy so that the input light 4 can be moved along the slanted reflection surface 18 by operating the input light directing device 6 to any desired core layer 16.

It may be difficult sometimes to distinguish a desired core layer 16 from a plurality of core layers 16. In such a case, the input light 4 is focused on the input edge of any core layer 16, after which the input light directing device 6 is operated to position the device 6 at either the front core layer or the rear core layer. Then, with reference to either of these two extreme layers, other core layers in between can be identified by the output value of the power. By following such a calibration data, any core layer can be identified to obtain the data contained in a hologram image 9 generated by that core layer.

Identification of extreme core layers is made by moving the input light 4 vertically through the various core layers 16 in the hologram element 1, so that the observed output power level will alternate periodically between high and low values so that the last high value would indicate either the front core layer 16F or the rear core layer 16R.

The task of obtaining data from a particular core layer 16 will be simplified if the holograms are recorded on core layers 16 that can be distinguished individually. In such a case, the input light 4 may be focused on any input edge of the core layers 16 of the hologram element 1, and when the particular core layer is noted from the value of the output optical power, using either of these extreme layers as a reference layer, relative positions of other core layers 16 can be determined by calculation. If a clad layer 17 is detected, the input light directing device 6 is operated to move to the nearest neighbor core layer 16, and using this core layer as the reference layer, the target core layer may be found by consulting the calibration data of power output and the position of the core layers, thus enabling to obtain the target data contained in the hologram image 9 in the target core layer 16.

Therefore, using the results of the optical power discrimination circuit 14, coupling of the input light 4 to a core layer 16 can be detected, and using the relative position information produced from the result of the optical power discrimination circuit 14 in conjunction with the reading of the counter 15, a targeted core layer can be determined accurately by moving the input light 4 using the input light directing device 6.

Apparatus 2

Apparatus 2 is a multi-layered selective hologram reading apparatus β and will be explained with reference to FIG. 3.

The apparatus β is comprised by: a laminated waveguide type hologram element 1a comprised by a plurality of recording layers containing scattering centers for producing a hologram image by the light propagating in a waveguide; a card medium 2a containing the hologram element 1a; an imaging light source 3a for emitting a beam such as a laser beam to inject a horizontal incident beam parallel to the surface of the hologram element 1a, but vertical to the vertical input surface 18a; a converging lens 5a to freely focus the beam from the light source 3a to generate input light 4a; an input light directing device 6a having a piezoelectric device for positioning the incident beam 4a by moving the light source 3a and the converging lens 5a as a unit.

Ancillary devices include: an optical power detector 13a for detecting the levels of the optical power of output light 11a transmitted from the vertical output surface 19a and extraneous scattered light output from regions other than the recording layer; an optical power discrimination circuit 14a for differentiating the output light 11a from the scattered light detected by the power detector 13a; and a counter 15a for counting the results output from the power discrimination circuit 14a. The power discrimination circuit 14a and the counter 15a are connected to the input light directing device 6a.

The hologram element 1a is comprised by a core layer 16a (which is a recording layer and converts the input light 4a to the guided waves 7a) alternating with a clad layer 17a which scatters the input light 4a.

Figure 3:
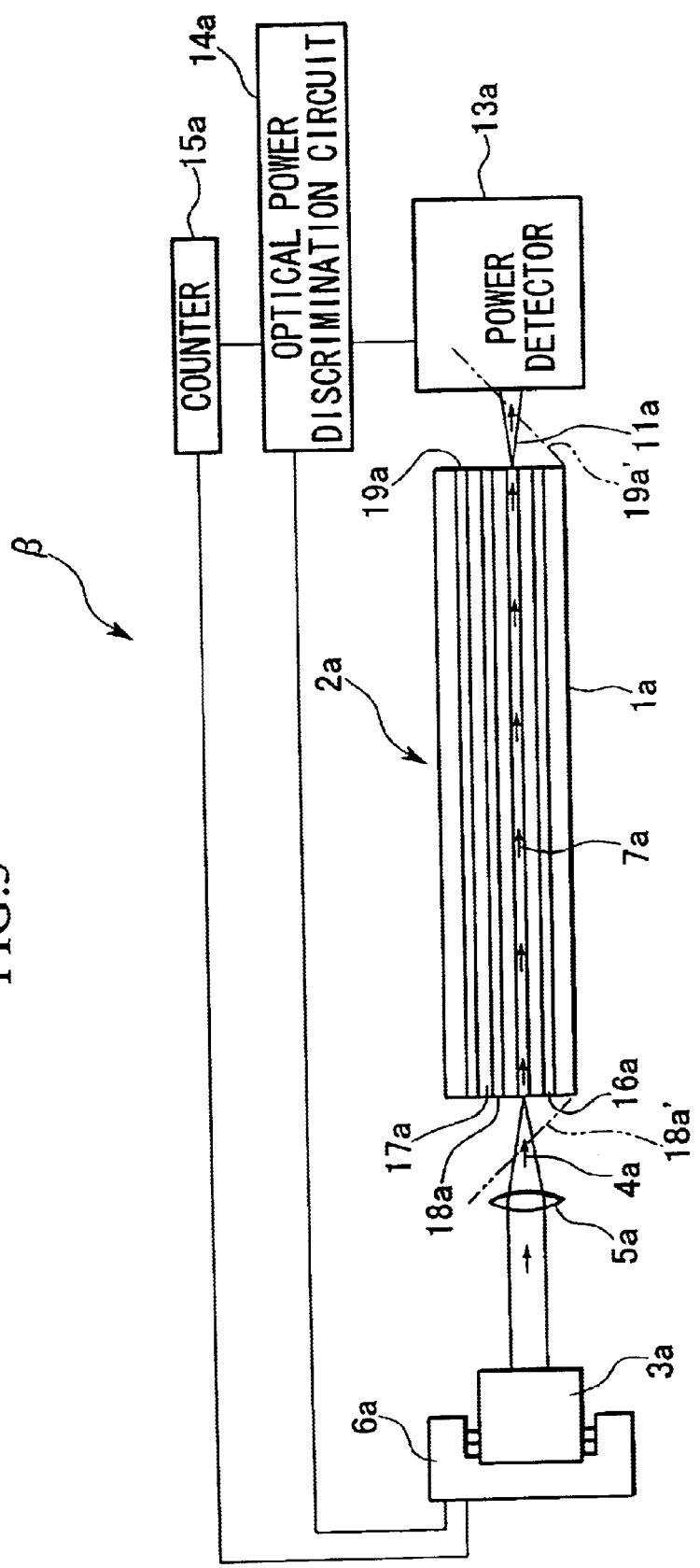
FIG. 3 is a schematic diagram of the configuration of Apparatus 2 of the selective reading apparatus in Embodiment 1.

The apparatus β is provided with a hologram image recording device having a solid state imaging element such as charge couple device (CCD) to produce holograms from the diffracted beams generated from the guided waves 7a in the hologram element 1a, but this is omitted from FIG. 3.

In Apparatus 1, the input light 4 is input at right angles to the layer surface of the hologram element 1, but in Apparatus 2, the input light 4a is input horizontally to the layer surface of the hologram element 1a.

Method 2

This method is applicable to Apparatus 2, and will be explained with reference to FIG. 3. Explanations that are not provided in particular are the same as those in Method 1.

In this method, the input light 4a enters the layer surface of the hologram element 1a horizontally, not at right angles as in Method 1.

Light emitted from the light source 3a is focused through the lens 5a to produce input light 4a and is injected in the layer of hologram element 1a through a vertical input surface 18a. The input light 4a couples with the input edge of the core layer 16a in the hologram element 1a and is output from the vertical output surface 19a as output light 11a, but in the clad layer 17a, the input light 4a is scattered to produce scattered light. Hologram data are obtained by recording a floating image produced at right angles to the element 1a with a hologram image recording device.

The optical power detector 13a detects the optical power of the light emitted from the hologram element 1a, and the optical power discrimination circuit 14a judges, using a suitable threshold value, whether the detected power is from the output light 11a output from the core layer 16a or scattered light output from the clad layer 17a, and the output count is summed in the counter 15a to obtain relative positioning data, and according to this relative positioning data, a target core layer 16a is selected, and the input light directing device is operated to align the input light 4a with the target core layer 16a.

It should be noted that apparatus β may be designed so that the hologram element 1a is provided with one slanted input or output surface, as indicated by the double-dot imaginary lines to show the input surface 18a' and the output surface 19a', so that the input light 4a enters the hologram element 1a at right angles and the output light 11a to emit at right angles to the surface of the core layer.

Apparatus 3

Apparatus 3 is a multi-layered selective hologram reading apparatus γ and will be explained with reference to FIG. 4.

The apparatus γ is comprised by: a laminated waveguide type hologram element 1b comprised by a plurality of recording layers containing scattering factor for producing a hologram image by the light propagating in a waveguide; an imaging light source 3b for emitting a beam such as a laser beam to inject a vertical incident beam at right angles to the layer surface of the hologram element 1b; a converging lens 5b to freely focus the beam from the light source 3b as input light 4b; an input light directing device 6b having a piezo-electric device for positioning the incident beam 4b by moving the light source 3b and the converging lens 5b as a unit; and a hologram image recording device 10b having a solid state imaging element such as CCD to record a hologram 9b generated by diffracted light 8A produced by the guided waves 7b propagating in the hologram element 1b and servo information 20 generated by diffracted light 8B.

Ancillary devices include: a servo information discrimination circuit 21 to distinguish the recording layers providing the servo information 20; an optical power detector 13b for determining the levels of optical power of output light 11b transmitted from the recording layer output edge at right angles to the layer surface of the hologram element 1b and scattered light output from regions other than the recording layer; an optical power discrimination circuit 14b for differentiating the output light 11b from the scattered light detected by the power detector 13a; and a counter 15b for counting the results output from the power discrimination circuit 14b. The servo information discrimination circuit 21, power discrimination circuit 14b and the counter 15b are connected to the input light directing device 6b.

The hologram element 1b is comprised by a lamination of a core layer 16b (a recording layer and propagates the input light 4b as the guided waves 7b) alternating with a clad layer 17b which scatters the input light 4b; and an input light reflection surface 18b for reflecting the input light 4b and coupling it to the input edge associated with the core layer 16b; and an output light reflection surface 19b to reflect the output light 11b from the output edge and control the direction of reflection.

Figure 4:
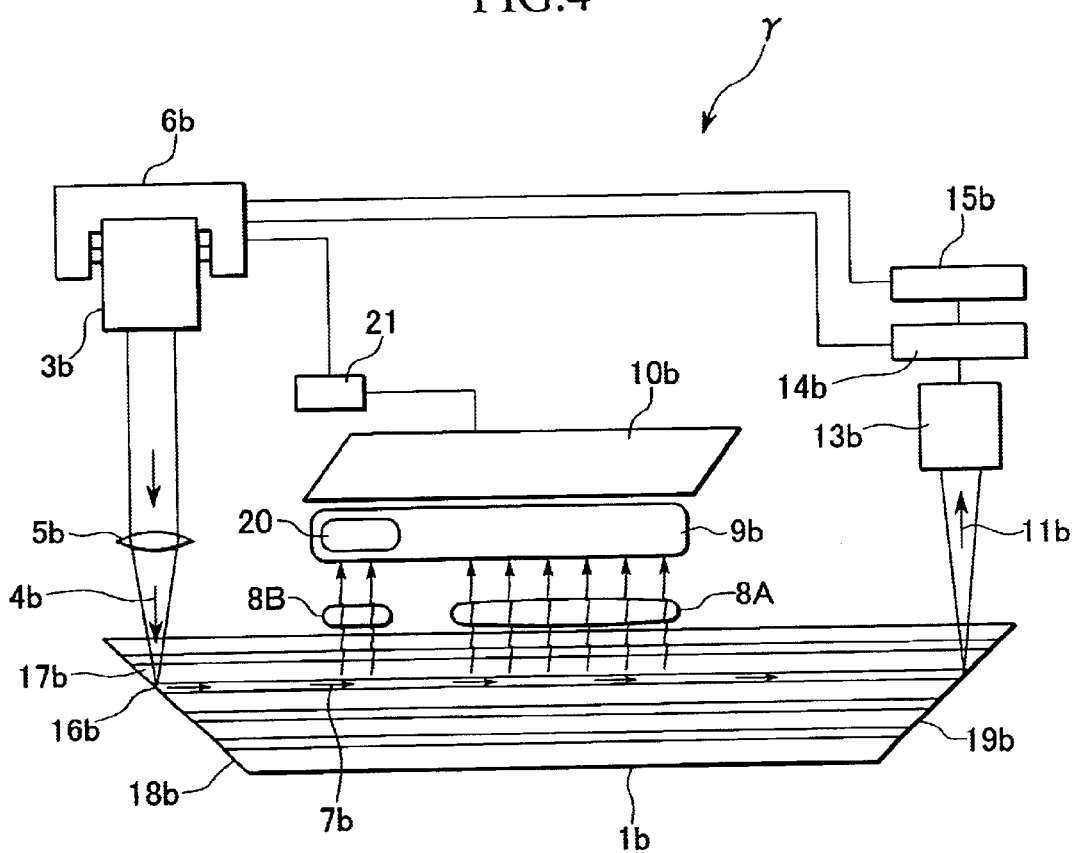
FIG. 4 is a cross sectional view of Apparatus 3 of the selective hologram reading apparatus in Embodiment 1.

The apparatus γ operates in conjunction with a laminated hologram image recording card having hologram element 1b, but this arrangement is omitted in FIG. 4.

Method 3

This method is applicable to Apparatus 3, and will be explained with reference to FIG. 4. Explanations that are not provided in particular are the same as those in Method 1.

Laser beam from the light source 3b is focused through the lens 5b to produce input light 4b, which is reflected at the input light reflection surface 18b and is coupled to the input edge of the core layer 16b, and the guided waves 7b thus produced are diffracted in part by the recorded hologram data in the hologram element 1b to produce diffracted beams to generate a floating hologram image 9b.

In the hologram image 9b, servo information 20 is recorded in the initial recording portion of the hologram 9b in the hologram element 1b, such that the hologram image 9b is produced by diffracted beams 8A and the servo information 20 is produced by diffracted beams 8B. The beams are generated at right angles to the layer surface of the element 1b, and the generated holograms 9b and servo information 20 are recorded by the hologram image recording device 10b.

In this case, it is necessary to extract the servo information 20 from a vast amount of data in the hologram 9b, but if a CCD is used for the hologram image recording device 10b so as to record the data in the initial portion of the recording medium, the focused float image of servo information 20 can be readily produced without having to scan the entire holographic data. This method provides a comparatively rapid access to the servo information 20.

The data in the servo information is identified by the data pre-registered by the servo information discrimination circuit 21, so that the absolute position of the core layer 16b being shown can be identified. Even if there are one hundred core layers 16b in the hologram element 1b, a minimum of seven bits are all that is needed to identify the servo information in each core layer.

The amount of memory required to record servo information is very small in comparison to the total memory capacity, so that by recording the servo information 20 for generating a floating image, there is negligible drop in the total memory capacity of the hologram element 1b.

Also, the optical power detector 13b detects optical power of light emitted from the hologram element 1b, and the optical power discrimination circuit 14 decides, on the basis of a threshold value, whether the optical power is to be attributed to the output light 11b from the core layer 16b or to the scattered light from the clad layer 17b. Depending on the situation, the total count of traversing the threshold value can be obtained by means of the counter 15b to determine the location of the core layer 16b currently producing the hologram.

To choose an input edge of the core layer 16b, it is permissible to move the input light 4b on the basis of the absolute position information supplied by servo information 20 by operating the input light directing device 6b, but after obtaining the absolute position information for one core layer 16b, the input light 4b may be moved according to relative position information determined on the basis of the optical power discrimination circuit 14b and the counter 15b.

Therefore, the loss of memory capacity in hologram element 1b is prevented by using only a small amount of position information supplied by the servo information judging circuit 21, thereby enabling to obtain the absolute position information for the core layer relatively quickly. The apparatus also enables to utilize data produced by combining the absolute position information with the relative position information produced by the optical power discrimination circuit 14b and the counter 15.

Apparatus 4

Apparatus 4 is a multi-layered selective hologram reading apparatus δ and will be explained with reference to FIG. 5.

The apparatus δ is comprised by: a laminated waveguide type hologram element 1c comprised by a plurality of recording layers containing scattering centers for producing a hologram image by the light propagating in a waveguide; an imaging light source 3c for emitting light such as a laser beam to inject a vertical incident beam at right angle to the hologram element 1c; a converging lens 5c to freely focus the beam from the light source 3c as input light 4c; an input light directing device 6c having a piezo-electric device for positioning the incident beam 4c by moving the light source 3c and the converging lens 5c as a unit; and a hologram image recording device 10c having a solid state imaging element such as CCD to record a hologram 9c generated by diffracted light 8C produced by guided waves 7c propagating in the hologram element 1c.

Ancillary devices include: a detector array 22, having light energy sensitive devices such as photodetectors (PDs), for recording servo information 20c produced by diffracted light 8D produced by guided waves 7c in the hologram element 1c; a servo information discrimination circuit 21c to identify the recording layers associated with the servo information; an optical power detector 13c for detecting the optical power of output light 11c transmitted from the recording layer output edge at right angles to the layer surface of the hologram element 1c and extraneous scattered light output from regions other than the recording layer; an optical power discrimination circuit 14b for differentiating the output light 11c from the scattered light detected by the power detector 13c; and a counter 15b for counting the results output from the power discrimination circuit 14c. The servo information discrimination circuit 21c, power discrimination circuit 14c and the counter 15c are connected to the input light directing device 6c.

The hologram element 1c is comprised by: a lamination of a core layer 16c (a recording layer and propagates the input light 4c as the guided waves 7c) alternating with a clad layer 17c which scatters the input light 4c; and an input light reflection surface 18c for reflecting the input tight 4c and coupling it to the input edge associated with the core layer 16c; and an output light reflection surface 19c to reflect the output light 11c from the output edge and control the direction of reflection.

Figure 5:
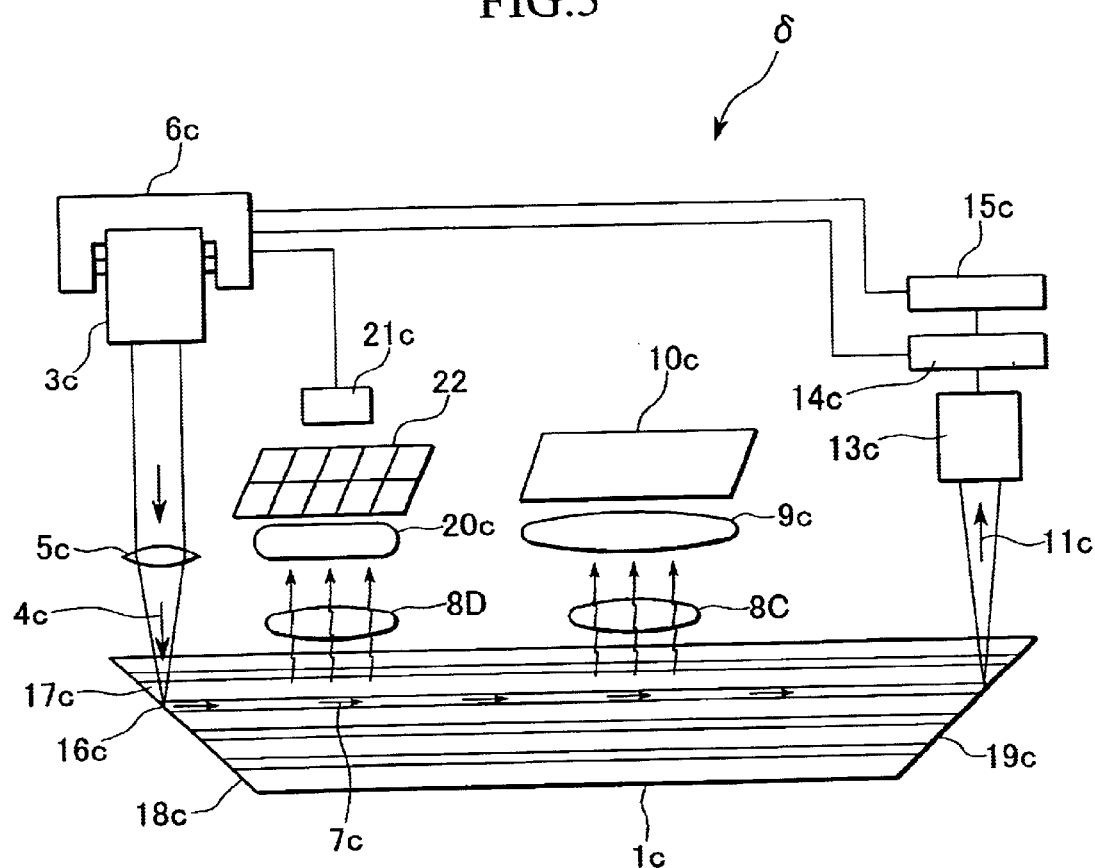
FIG. 5 is a cross sectional view of Apparatus 4 of the selective hologram reading apparatus in Embodiment 1.

The apparatus δ operates in conjunction with a laminated hologram image recording card having hologram element 1c, but this arrangement is omitted in FIG. 5.

Method 4

This method is applicable to Apparatus 4, and will be explained with reference to FIG. 5. Explanations that are not provided in particular are the same as those in Method 3.

Laser beam from the light source 3c is focused through the lens 5c to produce input light 4c, which reflects from the reflection surface 18c to couple with the input edge of the core layer 16c, and the guided waves 7c thus produced are diffracted in part by the recorded hologram data in the element 1c to produce diffracted beams 8C generating a floating image 9c, and a servo pattern information image 20c produced from diffracted beams 8D produced separately from the hologram image 9c is floated in a leading position. The floating image 9c and the servo pattern information image 20 are produced as separate floating images at right angles parallel to the layer surface of the hologram element 1c.

Servo pattern information image 20c may be comprised of a combination of checkered patterns or two-dimensional bar codes, but it is not necessary to limit to such patterns so long as the patterns are simple patterns to enable to identify different core layers 16c.

Hologram image 9c is recorded with a hologram image recording device 10c, and servo pattern information image 20c is recorded, not by the image recording device 10c, but by a highspeed recording device such as a PD array 22. Because the patterns used for servo pattern information image 20c are simple two-dimensional patterns, a small number of PDs would be acceptable to record the image even considering the need for error correction and image position adjustments.

As demonstrated in this example, by separating the servo pattern information image 20c from and displaying it ahead of the hologram image 9c, a highspeed array 22 can be used to record the image 20c, thereby enabling to quickly provide the data for servo pattern information.

The data contained in the servo pattern information is used by the servo information discrimination circuit 21c, in conjunction with pre-stored data, to identify the core layer 16c that is currently producing the hologram image, and are converted to absolute position information of the core 16c.

Also, the optical power detector 13c detects the optical power of the light emitted from the hologram element 1c, and uses the optical power discrimination circuit 14c, to determine, using a suitable threshold value, whether the power relates to the output light 11c output from the core layer 16c or to scattered light output from the clad layer 17c. In some cases, the output count is summed in the counter 15c to obtain relative positioning data of the core layer 16c currently producing the hologram image 9c.

To choose an input edge of the core layer 16c, it is permissible to move the input light 4c on the basis of the absolute position information supplied by servo information 2Oc by operating the input light directing device 6c, but after obtaining the absolute position information for one core layer 16c, the input light 4b may be moved also according to relative position information determined on the basis of the optical power discrimination circuit 14c and the counter 15c.

Therefore, by separating the servo pattern information image 20c from the produced hologram image 9c and recording the image 20c using a highspeed array 22, absolute position information can be obtained even more quickly than in Method 3, and because the number of PDs in the array 22 can be low, the apparatus can be made more compact and the price lower.

Embodiment 2

Examples in Embodiment 2 are related to holograms stored in a card medium, card reader and method.

Card Medium Example

Figure 6:
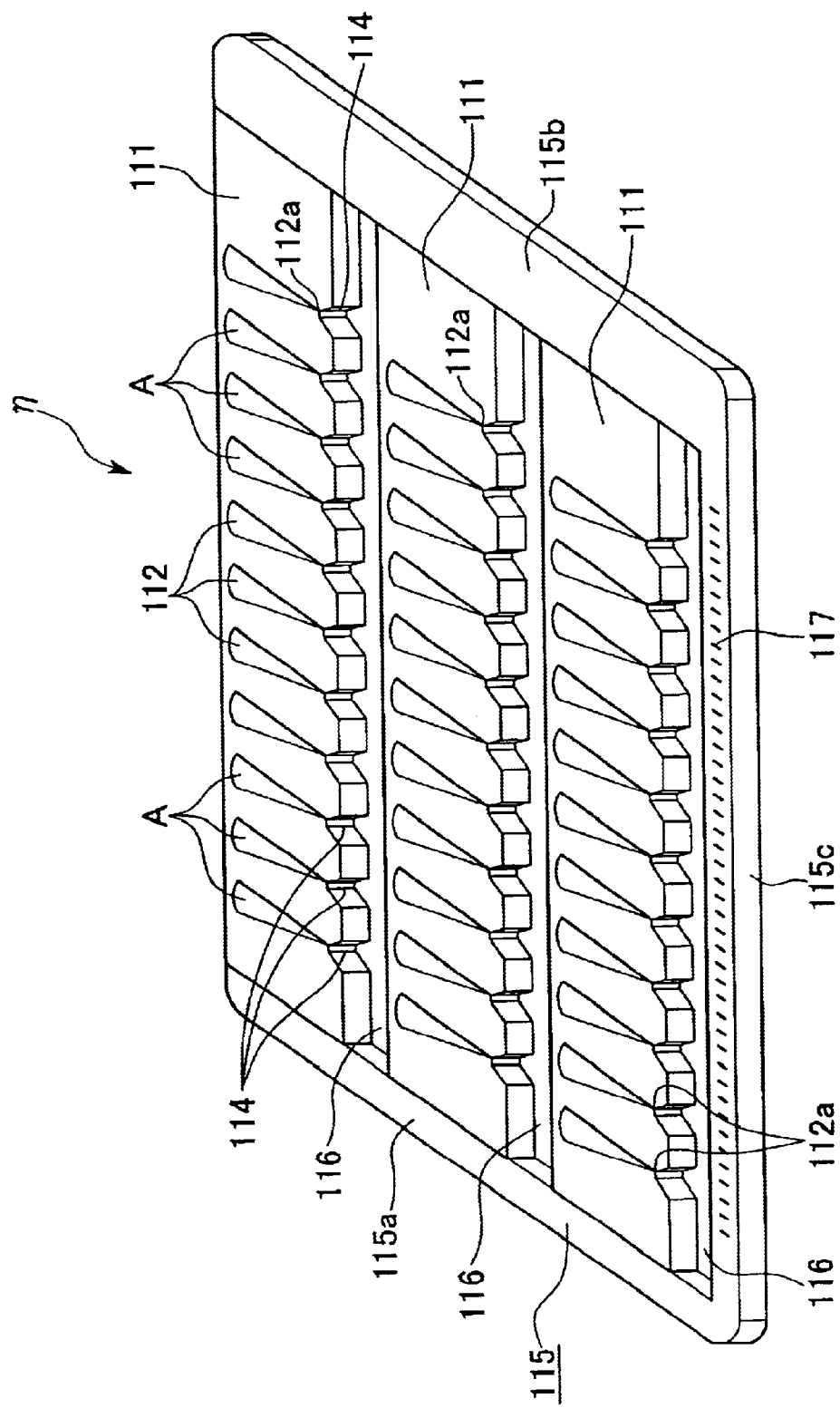
FIG. 6 is perspective view of an example of the information recording card medium in Embodiment 2.

FIG. 6 shows a perspective view of an example of the card medium. An information recording card medium η is comprised by laminated plates 111 including wedge-shaped recording sections A arranged in parallel in the longitudinal direction, each lamination recording section A comprised by a wedge-shaped hologram recording layer (core) 112 alternating with a wedge-shaped separation layer (cladding) 113 (refer to FIG. 8).

A head alignment groove 114 is a v-shaped illumination head alignment groove formed in the hologram lamination recording section A at the light input end 112a located at the transverse end, and a card frame 115 includes left and right frame sections 115a, 115b and a frame joining section 115c. A head seek groove 116 is for moving an illumination head longitudinally, and illumination head positioning markers 117 correspond with the v-notched head alignment groove 114 for illumination head positioning.

The card frame 115 may be a square frame or a latticed fame.

As shown in FIG. 6, the hologram plates 111 may be assembled into the card frame 115 with a space in between to produce one hologram card, and the spaces can be used as head seek grooves 116 for inserting the illumination heads. The same end result may be achieved by first producing a card-sized lamination and then machining the grooves 116 and the v-notched head alignment groove 114 in the card. The shape of the head seek grooves 116 should be decided on the basis of optimizing the installation efficiency for the hologram recording layers 112, the shapes of the illumination head 123, imaging element F for producing the hologram image H, as well as pickup arrangement for seek-access speeds. FIG. 6 shows a simple arrangement of linear shapes and parallel placements for illustration purposes only.

This example of the card medium has a narrow wedge-shaped recording layer 112, and tip sections (light injection window 112a for data read) are arranged on one side of the head seek groove 116, but it is permissible to arrange the recording layers 112 in alternating or randomly oriented arrangement so that both sides of the head seek groove 116 may be utilized for light input into each v-notched head alignment groove 114. This arrangement will improve the operational efficiency of the card medium.

Each recording layer 112 is structured so as to receive the input light L at the v-notched head alignment groove 114, so that this structure is constructed by stacking a layer 112 on top of another layer 112 to facilitate the manufacturing process of the hologram card medium. This design enables to avoid complications in assembling problems of the card medium, such as the need for staggered stacking of each recording layer 112 to produce a slanted input surface at the v-notched head alignment groove 114.

Apparatus Example

Figure 7:
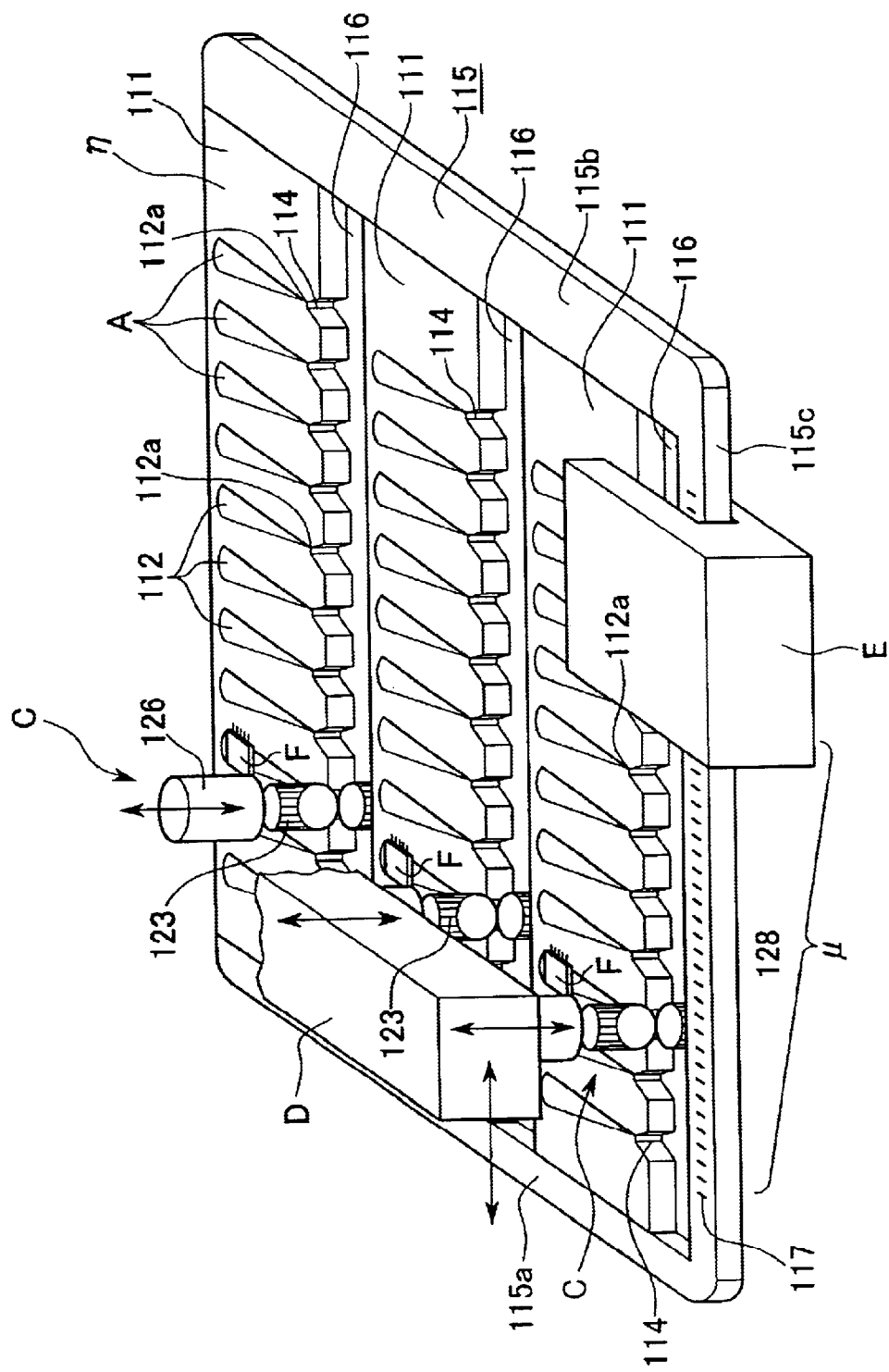
FIG. 7 is a perspective view of a part of the selective hologram reading apparatus designed for use with the information recording card medium shown in FIG. 6.
Figure 8:
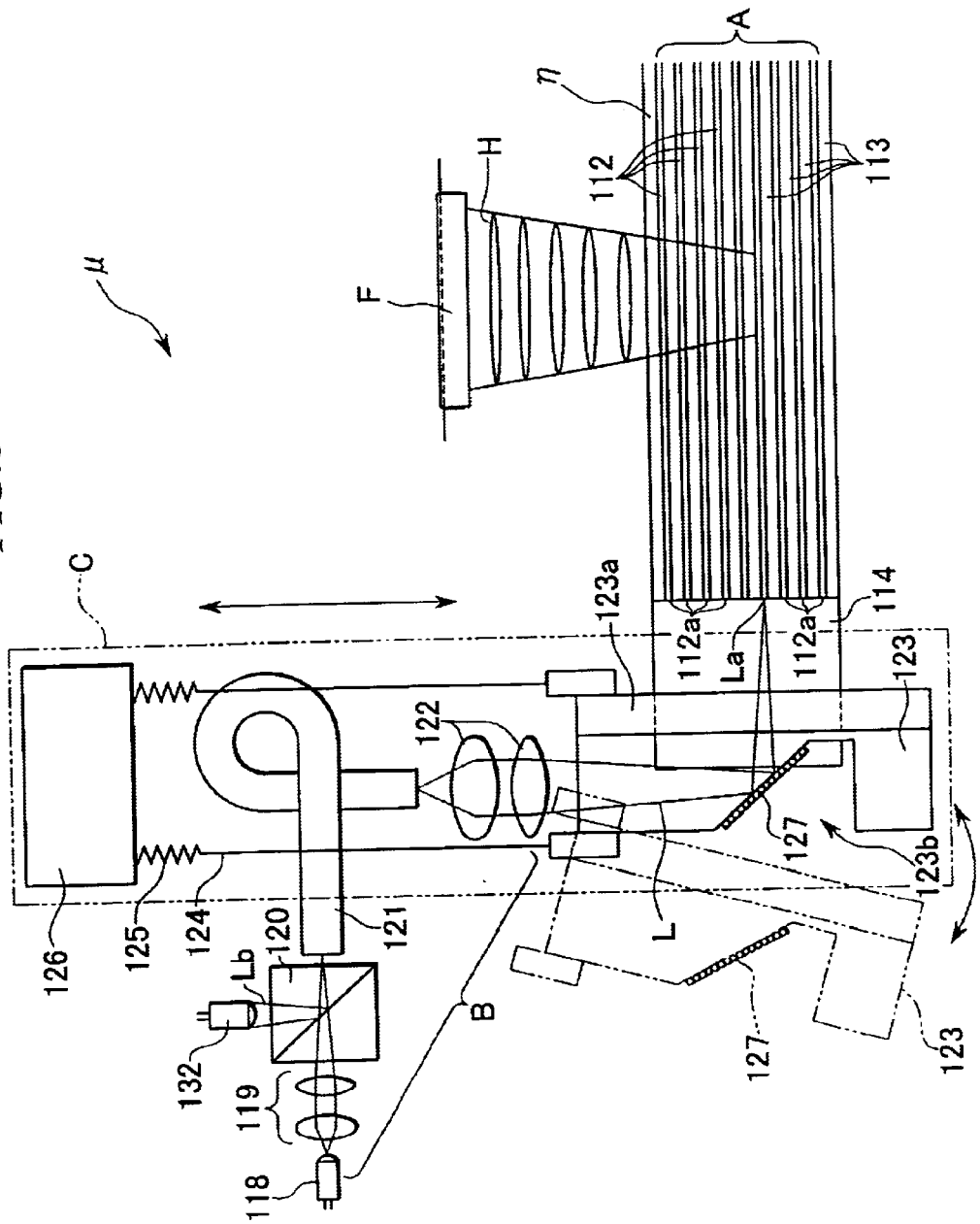
FIG. 8 is a schematic cross sectional view of the selective hologram reading apparatus in Embodiment 2.
Figure 9:
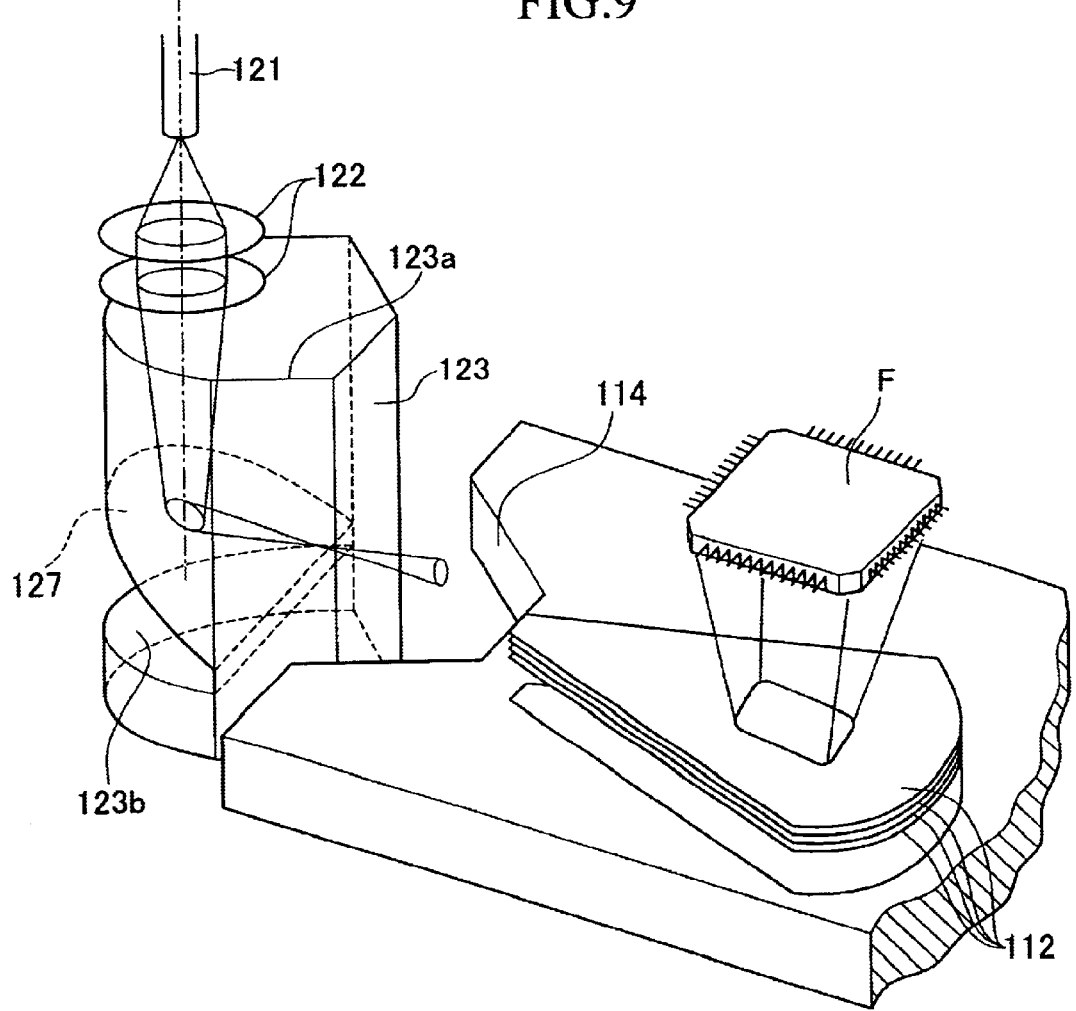
FIG. 9 is a perspective view of the essential parts of the selective hologram reading apparatus in Embodiment 2.

FIG. 7 shows a partial view of an apparatus used to read the card medium η, FIG. 8 shows a schematic overall view of the apparatus, FIG. 9 shows a perspective view of parts of the apparatus, and FIGS. 10A–10D show various designs of the illumination head.

The present card reading apparatus μ is an optical system and a section B is an optical system including: a laser source 118, a plurality of source light converging lenses 119, a reflected return light detector 132 for detecting the power of reflected light, light guides 121 such as optical fiber or waveguides, and a plurality of illumination light converging lenses 122.

Section C is a read head including an illumination head 123, a support tube 124, a tilting device 125 for head loading/unloading, an illumination head elevator actuator 126; section D is a read head transfer actuator for positioning the read head C directly under the bottom surface of respective head seek grooves 116 for light input into the information recording card medium η, as well as to move the head horizontally along the head seek groove 116.

Section E is a marker detection sensor which rides on a u-shaped rider to freely slide along the connecting frame 115c to detect the position of the illumination head positioning markers 117 scribed in the longitudinal direction of the connecting frame 115c of the card frame 115 of the recording medium η. Section F is an imaging element for recording a floating hologram image H produced by coupling the input beam to the input section 112a of the recording layer 112 containing the target hologram.

The light guides 121 has an input end extending out from the support tube 124 but most of it is housed inside the tube 124, and houses a converging lens 122 to focus the illumination beam L.

The illumination head 123 couples its output light to the card medium η by fitting a v-shaped coupling edge 123a to fit into the head alignment groove 114, and is attached to the bottom end of the support tube 124 in such a way that it can be swung away from the tube, as shown by double-dot imaginary line in FIG. 8, to tilt away from the head alignment groove 114 by means of the head tilting device 125.

FIG. 10A–10D show various designs of the illumination head 123. In the basic design shown in FIG. 10A, the beam output section is made of a transparent material such as glass which is shaped into a shaped transparent wedge having coupling edges 123a to fit into the head alignment groove 114, and a reflection mirror 127 inclined at 45 degrees is installed on the inner ceiling surface 123c of the polarizing mirror section 123b, in such a way to reflect the longitudinal illumination light L emitted from the illumination head 123 to a transverse direction into a waveguide of the card medium η.

Figure 10A:
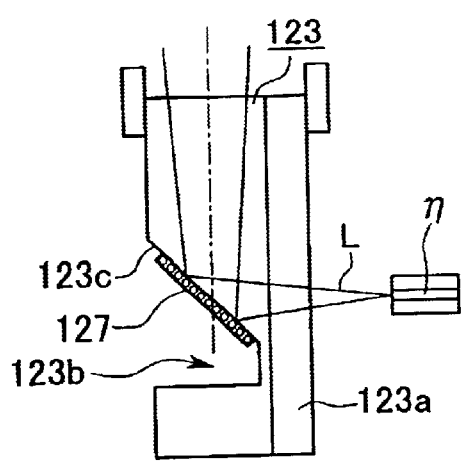
FIGS. 10A~10D are cross sectional views of various examples of the illumination head for use in the reading apparatus in Embodiment 2.
Figure 10B:
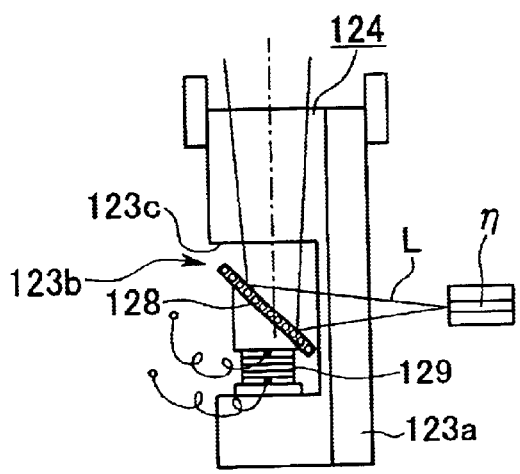

In the design shown in FIG. 10B, a separately prepared reflection mirror 128 is installed on top of a piezo-electric element 129 at 45 degrees, in the depression section 123b of the polarizing mirror section 123 having a horizontal inner ceiling surface 123c. This design permits precision beam positioning without moving the bulky illumination head 123 or lens 122 and light guide 121.

Figure 10C:
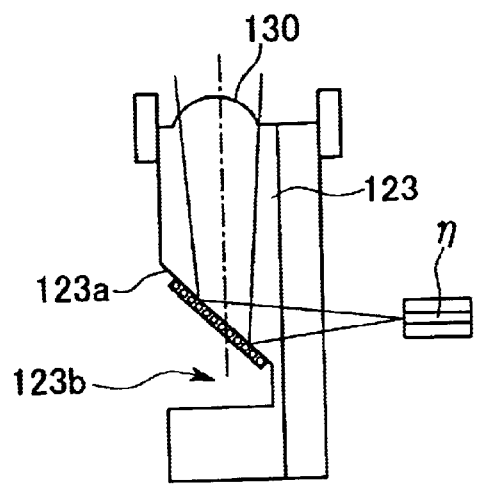
Figure 10D:
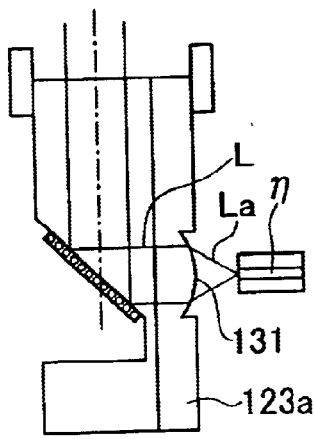

In the designs shown in FIGS. 10C and 10D, the function of the converging lens 122 is performed by having a three-dimensional transparent spherical dome 130 on top of the illumination head 123 placed in the optical path of the laser beam, by bonding a semi-sphere lens, or forming a transparent film by sputtering and shaping, for example. This design of the head reduces the weight of the illumination head system so that it can be moved quickly to increase the access speed as well as reducing the number of required parts to reduce the cost of the apparatus.

In the design shown in FIG. 10D, an arc surface 131 is formed integrally on the illumination head 123 so as to be closer to the focusing point of the illumination beam L, so that the focus length is shortened thus allowing the aperture of the beam spot La to be decreased to improve the margin of accuracy in positioning the illumination beam L.

Method Example

Examples of the process of aligning the illumination head with respect to the recording layer in the hologram card η will be illustrated with reference to FIGS. 7~9 and FIG. 11.

Figure 11:
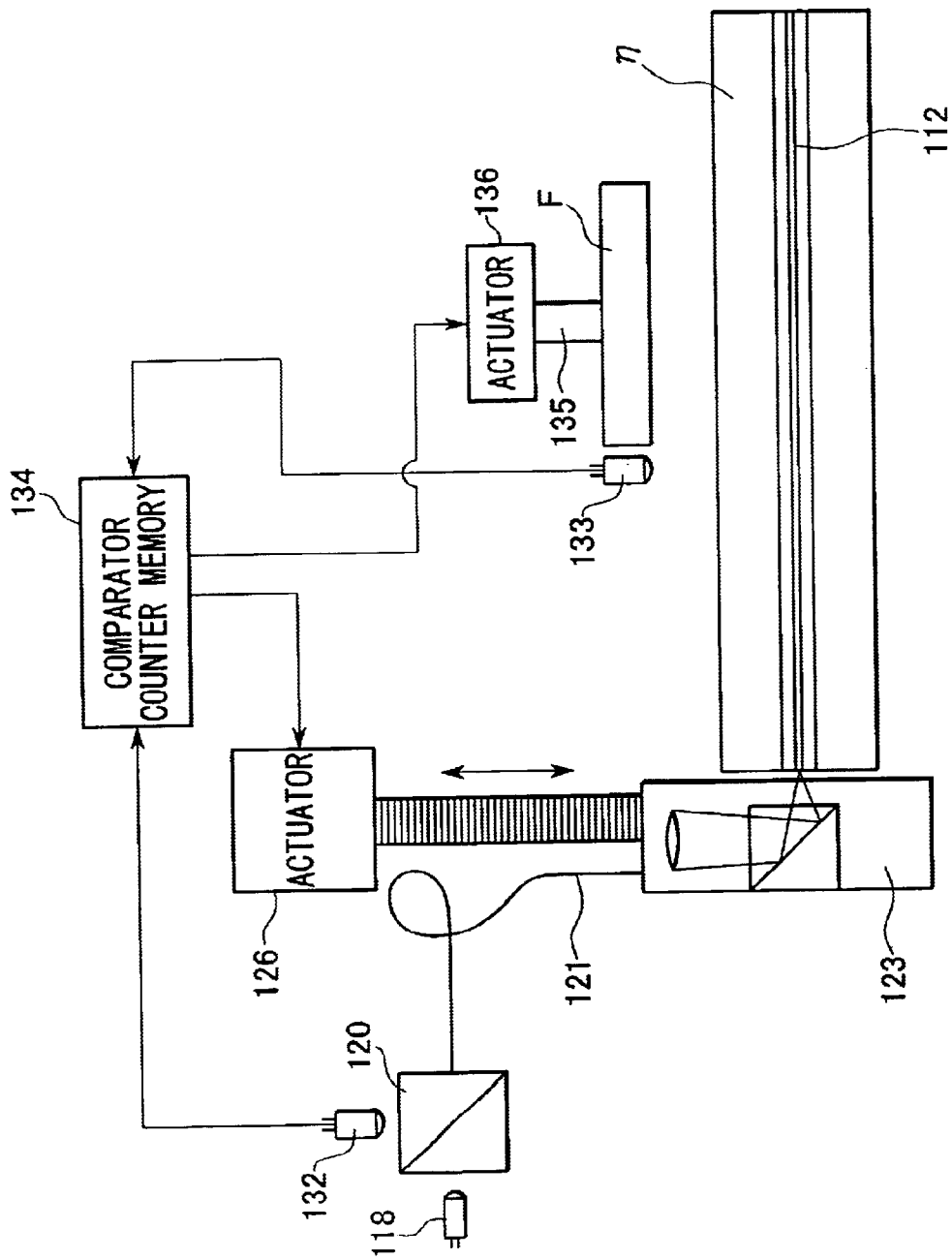
FIG. 11 is a block diagram to illustrate rough positioning and precision positioning processes for the selective hologram reading apparatus in Embodiment 2.

FIG. 11 shows a block diagram to illustrate the steps for performing rough alignment and precision alignment in a system comprised by a reflected return light detector 132; an output power detector 133; a comparator counter memory 134; a recorder support section 135; and an elevator actuator 136 for the recording device.

First, a head positioning marker 117 corresponding to a desired head positioning v-notched head alignment groove 114 is identified on the connecting frame 115c of the card medium η. Next, the illumination head 123 is tilted by operating the head tilting device 125 to detach the head 123 from the head alignment groove 114, and moving the head 123 along the head seek groove 116 to a position of the targeted marker 117 opposite to the desired head alignment groove 114. In this position, the illumination head 123 is stopped temporarily to perform preliminary rough positioning.

Next, the illumination head 123 is reset in its extreme top or bottom position as necessary, and is coupled in the vertical position to the head alignment groove 114. Next, a secondary positioning steps carried out by raising or lowering the head 123 within the head alignment groove 114 to position the head 123 opposite to the target core layer in the lamination recording section A, so that the illumination spot La is precisely aligned in three-dimensions with the input window 112a of the target core layer.

The process will be explained in more detail. The recording medium η has many layers of recording layers 112 at interlayer spacing of several micrometers in the card thickness direction. To select a target layer containing a particular hologram in such a laminated structure, it is necessary to identify the desired recording layer 112 correctly so that the illumination beam L can be directed at the input window 112a of the specific hologram recording layer 112 within an allowable angle of incidence.

A method of achieving such a process is illustrated in FIG. 9. The illumination 123 is shaped to match the head alignment groove 114 fabricated at the light injection window position, therefore, the head 123 can be fitted into the head alignment groove 114, so that the beam spot La from the head 123 is automatically fitted in the v-notch 114, as in a V-block jig, to track the input window 112a to reproduce a hologram image H.

The illumination head elevator actuator 126 for head elevator only needs to drive (to position) the head 123 in the normal direction to the card medium η, so that there is no need for in/out or lateral adjustment with respect to the card medium η. This method reduces the amount of work performed by the control mechanisms, and improves the access time for selecting a desired recording layer 112.

FIG. 8 shows detailed steps of positioning the illumination head 123 with respect to the card medium η. At this time, the following components are in a standby condition: illumination head elevator actuator 126 for raising or lowering the illumination head 123 or converging lens 122 and light guide 121 (optical fiber) together as a unit at right angles to the surface of the card medium η; the laser source 118 used to read the holographic information; and the reflected return light detector 132 for detecting the power level of the reflected return light Lb returning from a core or cladding.

As explained above, there is no need for three-dimensional adjustments of the head 123 with respect to the light injection window 112a because the height adjustment is all that is needed. For precise aligning of the beam L with the window 112a of the recording layer 112, the difference in the reflectivity of the recording layer 112 (core layer) and the separation layer 113 (cladding layer) can be utilized. The difference in the optical power of reflected return light Lb is detected by the photo-detector element in the reflected return light detector 132 monitoring the light reflected from the optical separator 120.

A suitable threshold value of the reflected light power is stored in the comparator counter memory 134 and the total count of traversing the threshold value is tracked to obtain the number of traversing the recording layers 112 so that rough aligning of the illumination head to the light injection window 112a can be achieved by operating the illumination head elevator actuator 126. After the initial rough positioning, the actuator 126 is again operated to align the head 123 exactly with the window 112a.

Also, when the beam L is aligned exactly with the light injection window 112a of the recording layer 112, a hologram image H will be generated in a space above the card medium η, therefore, an output power detector 133 may be provided near the imaging element F, for recording the hologram image H, as shown in FIG. 11. The peak power will be detected by the detector 133.

In a similar manner as above, the number of traversing the recording layer 112 by the head 123 may be detected by counting the dark/light cycles using the comparator counter memory 134 to perform the rough positioning. After the desired recording layer 112 is aligned roughly with the illumination head 123 by means of the illumination head elevator actuator 126, precision alignment can be performed by using the elevator actuator 136 for the recording device to finely focus the hologram image H to be recorded by the imaging clement F.

As shown in FIG. 8, the foregoing positioning operation is carried out using the head tilting device 125 so that the head 123, which is normally supported freely in a tilted standby position, can be pressed against the v-notch 114 for head alignment so as to couple/slide against the head alignment groove 114, when it is necessary to reproduce hologram information.

When it is necessary to move the head 123 to other group of recording layers 122, possible damage to the head 123 or to the v-notch 114 can be prevented by detaching (unloading) the head 123 from the head alignment groove 114 at an angle away from the support tube 124 in the standby position, and when a desired recording layer 122 is reached, the head 123 is again pressed into the head alignment groove 114 by means of the head tilting device 125 to couple (load) with the v-notch 114 to align the head 123 with the light injection window 112a of the recording layer 122.

It can be appreciated that, when aligning the beam L with the recording layer 122 by coupling in the v-notch 114, fabrication precision of the v-notch 114 affects the precision of alignment. For example, as shown in FIG. 8, it is possible to perform rough and precision positioning of the head 123 to the recording layer 122 can be carried out in the normal direction to the card medium η (vertical direction).

On the other hand, in the longitudinal direction of the card medium η (direction of the bead seek groove 116), the fabricated shape of the v-notch 114 and the relative position relation of the recording layer 112 and the light injection window 112a will affect the aligning precision. In this respect, to moderate the effect of possible mismatching between the illumination beam L and the light injection window 112a, caused by card fabrication process, the planar spot shape of the beam spot La may be altered by modifying the optical system in the light path to result in an elongated circle or a parabola having the major axis lying in the longitudinal direction of the card medium η.

The method will be summarized in the following. The illumination heads 123 are inserted in the respective head seek grooves 116 of the card medium η. When a desired group of recording layer 112 is specified, the mark detection sensor E reads the position information of the head alignment groove 114 for a group of recording layers 112, which is pre-recorded in the card medium η. The illumination head elevator actuators 126 then moves the heads 123, which are in a slanted standby orientation, to the desired position for the head alignment groove 114, and stops there.

The roughly positioned illumination heads 123, after being reset to the top or bottom position limit in the laminated section A, are press coupled into the n-notches 114 by means of the head tilting devices 125 so as to be on-track with the light injection windows 112a. The heads 123 are then moved vertically in the v-notches 114 so as to identify the desired recording layers 122, according to the procedure described above, and after precision alignment, beams L are generated to obtain the data contained in the hologram images H.

The operation of moving (seek operation) the illumination heads 123 to the head alignment groove 114 can be carried out by individual actuators D for each head 123 to move in each head seek groove 116, or the relative positions of the heads 123 may be fixed, and the entire head group may be moved through a group of respective head seek grooves 116.

Resetting of the top and bottom limits of illumination head 123 may be performed at any suitable time during the rough position operation.

Embodiment 3

Examples in the Embodiment 3 are related to another configuration of the card media, card reading apparatus and method.

Figure 12:
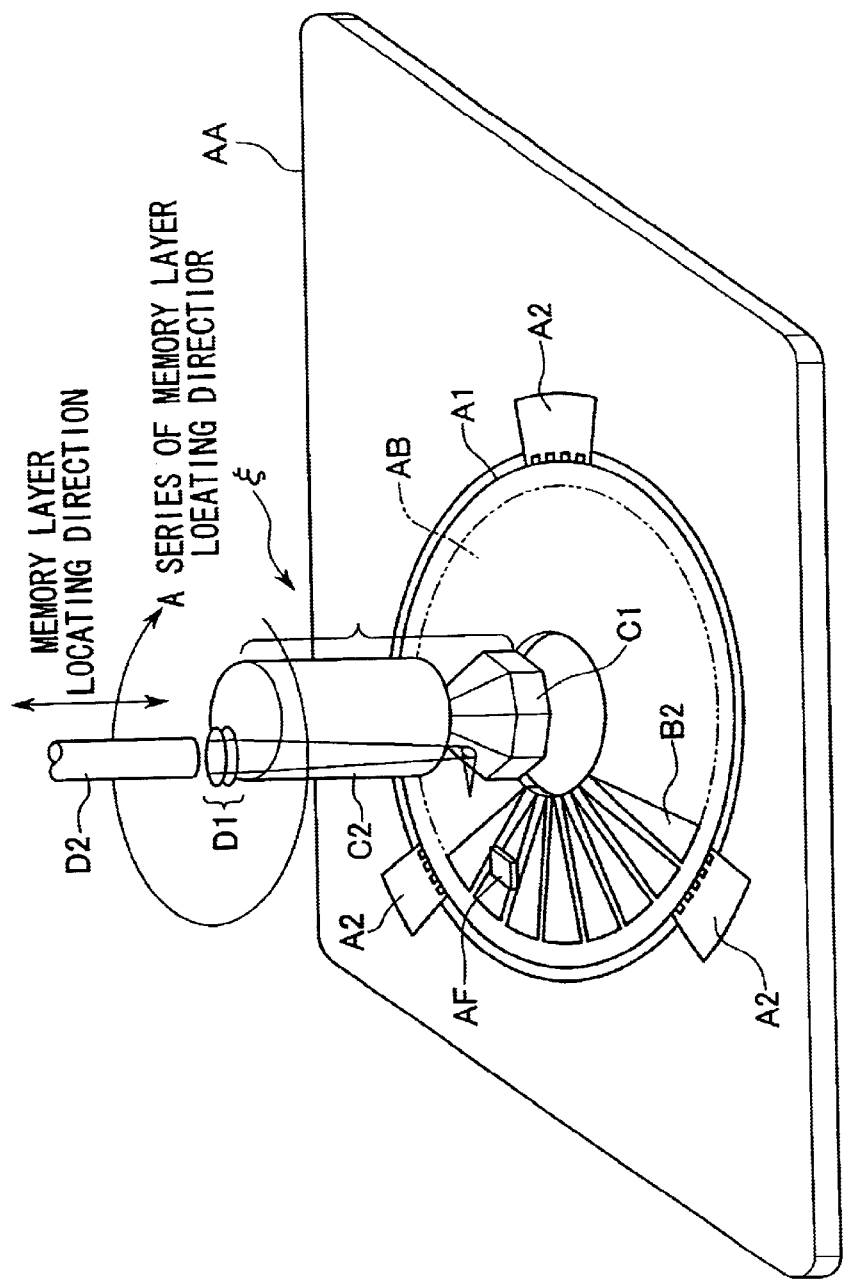
FIG. 12 is a perspective view of the hologram storage card medium placed in a card reading apparatus in Embodiment 3.
Figure 13:
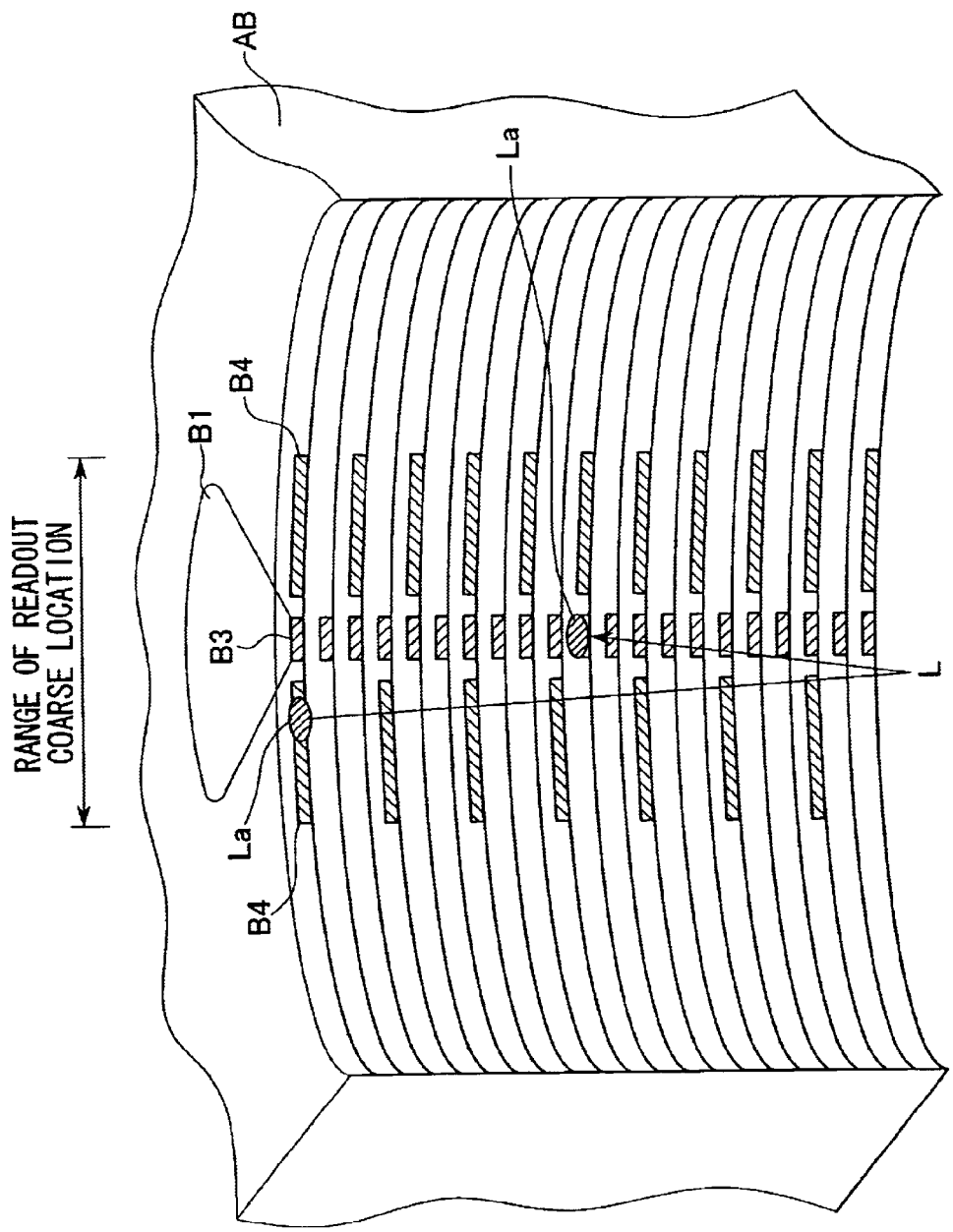
FIG. 13 an enlarged partial perspective view of the card medium placed in the reading apparatus in Embodiment 3.
Figure 14:
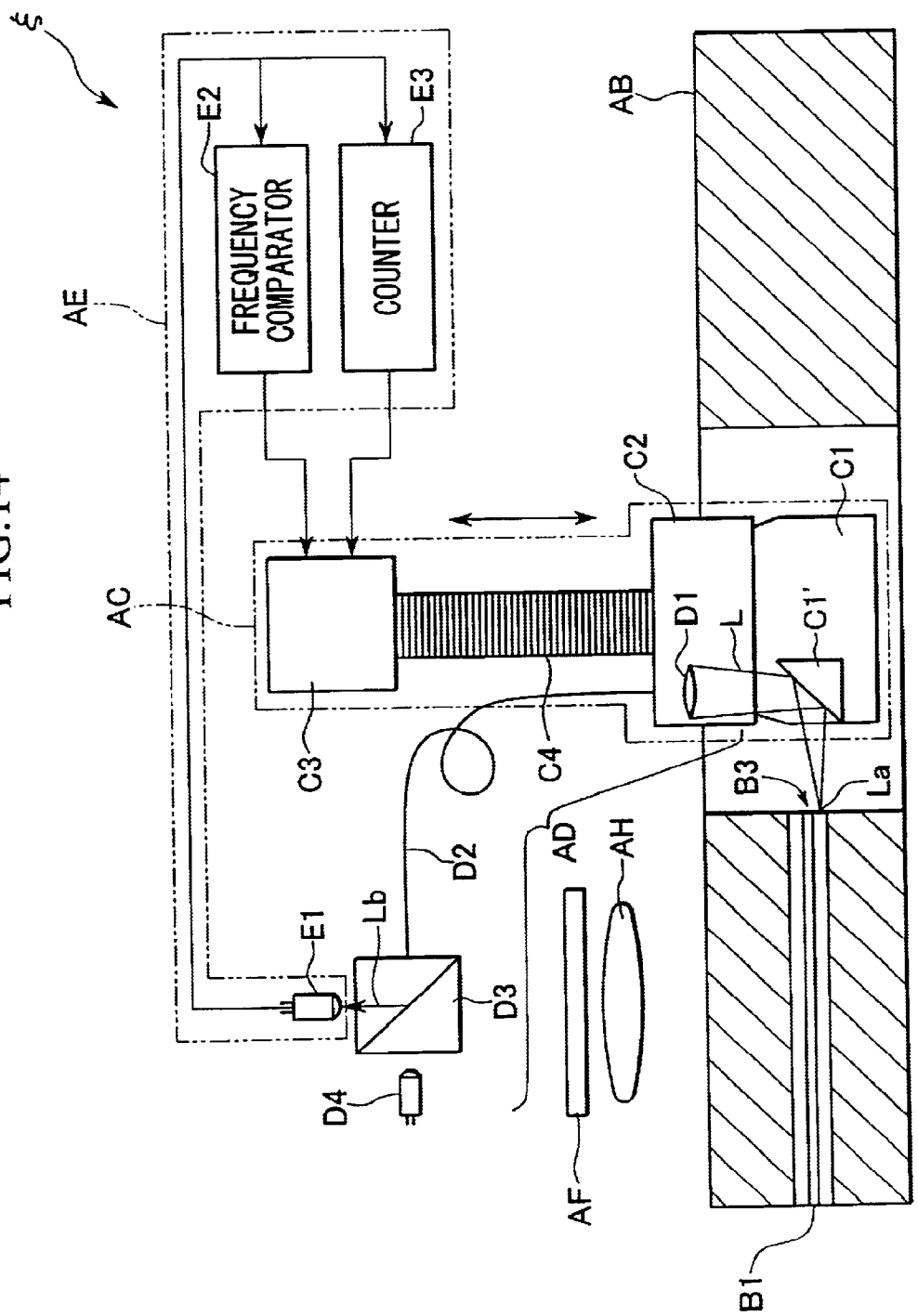
FIG. 14 is a block diagram of the configuration of the selective hologram reading apparatus in Embodiment 3.

FIG. 12 shows a perspective view of another configuration of the card medium AA, placed in key parts of a card reader ξ. FIG. 13 shows a partial enlarged view of the inner periphery of the card medium AA shown in FIG. 12, and FIG. 14 shows a block diagram of the card reader ξ designed to read the card medium AA.

Card Medium Example

The card medium AA has a disc AB in which a number of the wedge shaped recording sections B2, having a laminated recording layer B1, are embedded in a ring-shape in the disc AB, and is provided with solid-state drive device A2 touching the outer periphery of the disc AB which is freely rotatably supported in a circular disc housing cavity or a depression A1, to rotate the disc AB with respect to the card medium AA. The solid-state drive device A2 is most adaptable to ultrasonic motor (traveling-wave acousto-elastic element) which is locked by friction when not in use, but other devices such as normal electro-magnetic motor, static electrical motors are also suitable.

The disc AB of the recording medium AA is comprised by opposing marker layers B4 surrounding a series of input windows B3 in the middle, as shown in FIG. 13, and the marker layers B4 are provided to produce different periodic arrangements on both left and right or one side of the light injection windows B3. The pattern of arranging the marker layers B4 need not be limited to that shown in FIG. 13 so long as the series of light injection windows B3 can recognize the left and right marker layers 4.

Apparatus Example

As shown in FIG. 14, the card reader ξ includes: an optical system AD comprised, successively in an optical path, by: an illumination head AC, a converging lens D1 for focusing the illumination laser beam, a light guide D2 for guiding the light to the reading head AC, a beam splitter D3, a light source D4 to generate a hologram image H; an actuator control circuit AE having a reflected return light detector E1 to detect the reflected light Lb from the beam splitter D3, a frequency comparator E2 for separating and comparing frequency components in the photo-conversion signals of reflected light Lb detected by the reflected return light detector E1, a counter E3 for counting the number of times of traverses across a threshold value made by the power levels; an image recording device AF for recording the produced hologram image and converting the image to electrical signals. FIG. 14 shows only a portion of the recording layers B1.

The reader head AC contains a mirror section C1' for changing the illumination light path and includes an illumination head C1 for generating a produced hologram image H by illuminating a desired recording layer B1, and a support tube C2 housing an output side of the light guide D2 and a converging lens D1'. Optical fibers are most suitable for light guide AD. In this drawing, device element and circuits required for the image recording device AF are omitted. The reader head AC is not shown in FIG. 12 but it is the same reader as that shown in FIG. 14. The reader head AC shown in FIG. 14 has a positioning actuator C2 connected to the frequency comparator E2 and the counter E3, and a bellows section C4 so as to permit a rotational control and control of the vertical movement in the axial direction of the disc AB.

Method Example

The present method is applicable to the card medium and the card reader described above, and will be explained with reference to FIGS. 12 to 14. The method of positioning the illumination head will be illustrated in terms of accessing a recording layer B1 in a card medium AA.

To produce a hologram image H from a recording layer B1 of the card medium AA, the support tube C2 and the bellows C4 are rotated as a unit by means of a head positioning actuator C3, and the illumination head C1 is lowered in the axial direction of the disc AB so as to inject a beam L into a light injection window B3 of a desired recording layer B1. When the positioning of the head C1 is completed by aligning the beam spot La on the light injection window B3, a floating hologram image H is generated in a space away from the recording layer B1. The image recording device AF is brought to the location of the hologram image H to record the image which is converted to electrical signals to produce output data to be transmitted.

In reading the hologram image H, it is permissible to keep the illumination head C1 stationary while rotating the disc AB using the solid-state drive device A2, or conversely, the disc AB may be made stationary while the illumination head C1 may be rotated. Also, it is also possible to rotate both the disc AB and head C1 in opposite relative directions to speed up accessing the recording layer B1.

A method of illuminating a specific recording layer B1 will be explained in the following with reference to the structure of the disc AB illustrated in FIG. 13.

First, rough positioning is performed by locating the laser beam spot La near the light injection window B3 of the desired recording layer B1. A series of marker layers B4 is fabricated when the card medium AA is produced so as to identify recording layers B4 fabricated in different cyclic patterns on one or both sides of the light injection windows B3.

Next, properly positioned head C1 is lowered in the axial direction of the disc AB to perform lateral alignment of the beam spot La. Suppose that the marker layer B4 are distributed in a pattern shown in FIG. 13 and if the beam spot La happens to be located on the right of the desired line of light injection window B3, periodicity dark/light variations of the returning light reflected from the disc AB will be twice the periodicity along the windows B3. When the spot La is located on the left of the desired window B3, periodicity of the variations will be three times that along the windows B3. In this example, a logic control circuit may be programmed in such a way that, if the scanning factor is two times, the beam spot La is moved to the left while if the factor is three times, the beam spot La is moved to the right. By following such a procedure, the beam spot La can be aligned with the desired light injection window B3.

After the beam spot La is on-track, the actuator control circuit AE is operated to lower the beam L successively from the front edge of the disc AB, and by counting the peaks registered by the return light spot La using the counter E3 or counting the number of hologram images H using the detector element 133, to access the desired window B3 with the beam spot La.

It should be noted that although the invention was embodied in the specific example presented above, other variations are possible within the principle of the hologram generation and recording technique which will be summarized below.

For example, in the above embodiment, in an attempt to make the illumination head as compact as possible, the input light is divided by the beam splitter D3 and guided by a light guide (optical fiber) and a part of the input beam L is reflected by the beam splitter E3 to produce the reflected return light Lb to be detected by the reflected return light detector E1. However, the laser source D4 and reflected return light detector E1 and other components may be incorporated in the illumination head structure.

Also, as shown in FIG. 12 and 14, there is no need to limit the illumination beam L to one beam, a plurality of illumination beams may be shared with one image recording device AF.

Also, the rotational movement for the card medium AA can be generated by means other than the solid-state drive device A1, such that the disc AB may be supported by ball bearings or fluid bearings, and the main body of the read apparatus ξ may be connected to a rotational device (an electrical motor).

Rough positioning of the beam L on the disc AB of the card medium AA may also be carried out by including the position data for the windows B3 in positioning markers placed on the periphery of the disc AB, for example. Although not shown in the drawings, such reference markers can be used to define various circumferential locations in the disc AB.

In the above embodiment, the card medium AA is provided with only one disc AB, but, depending on the dimensions of the card medium and the disc AB, a plurality of discs AB may be incorporated in one card medium AA. Also, it is not necessary that the disc AB to have a laminated structure of the recording layers, and a single recording layer will be quite acceptable. The positioning methods described above would be applicable if a single layer is stacked as a stacked layer structure.

Although the card medium AA and the disc AB are assembled into a single unit with the use of a drive device A2, the disc AB may be a portable storage device so that the drive device A2 and the rectangular frame section may be incorporated into a reader apparatus.

Although the input light was injected from the inner periphery of the disc AB, light may be input from the outer periphery of the disc AB.

Embodiment 4

Examples in the Embodiment 4 are related to another configuration of the card media, card reading apparatus and method.

Figure 15A:
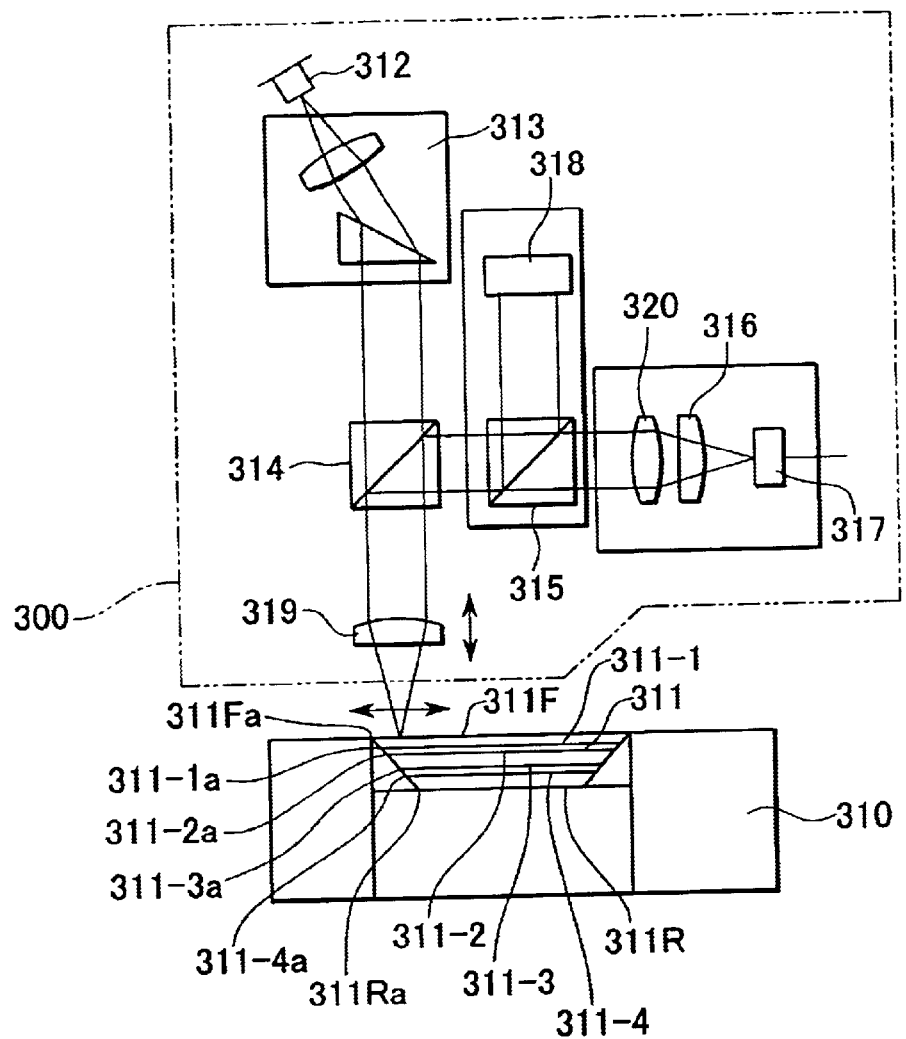
FIGS. 15A, 15B are, respectively, a schematic illustration of the selective hologram reading apparatus and the process of precision alignment in Embodiment 4.

FIG. 15A shows a configuration of the card reading apparatus in Embodiment 4.

An information output apparatus 300 is comprised by: a laser source 312; a collimator system 313 for shaping the laser beam; a first beam splitter 314; a second beam splitter 315; a converging lens 320; a cylindrical lens 316; 4-sector detector 317; an edge detection circuit 318; and an objective lens (converging lens) 319. A memory card 310 has a laminated recording structure, and is placed in an information output apparatus 300. The apparatus 300 injects light into the memory card 310 and obtains information from a desired waveguide layer stored in the hologram section 311 produced by the reflected light.

The multi-layered hologram section 311 is comprised by four waveguides 311-1~311-4, which are multi-layered core layers and cladding layers. The lateral surfaces of at least the left and right ends of the waveguides 311-1~311-4 are slanted at an angle of 45 degrees. Information is recorded on either the front or the rear surface of each waveguide serving as information recording surfaces, and the information is recorded as a series of bumps and dents representing data computed according to Fourier transform optics.

In this example, the hologram is comprised by four waveguides but a larger number of waveguides (for example, 10~500 layers) may be incorporated in one memory card to enable even higher memory capacity. Such waveguides can be mass produced using photolithographic techniques.

Data may be read from any particular waveguide layer in the hologram section 311, for example 311-1, in the following manner. A laser beam emitted from a laser source 312 is shaped by passing the beam through a collimator system 313, and a part of the input beam transmitted through the beam splitter 314 is focused by the converging lens 319 on the slant surface 311-1a of the waveguide 311-1. The laser beam is refracted and propagates horizontally inside the waveguide 311-1. The propagating light is scattered by the bumps and dents formed on the recording surface, and is captured by area-type photo-detector such as CCD (not shown) to read the data recorded in the waveguide 311-1.

Method 1

Method 1 relates to aligning of the beam spot accurately with a desired layer of the four waveguides 311-1~311-4.

Method for Finding a Waveguide Location in a Lamination

First, the locations of the front surface 311F and the rear surface 311R (with respect to the propagation direction of the beam) are identified by noting the changes in the reflected light intensity. Reflected light changes its direction in the beam splitter 314 and passes through a beam splitter 315, a converging lens 320 and a cylindrical lens 316, and is focused on the input surface of a 4-sector detector 317. Cylindrical lens 316 causes astigmatism in the longitudinal and transverse directions of the cylinder, to focus the light on the 4-sector detector 317 as a circular beam spot. In an out-of-focus state, the distribution of optical power becomes elliptical so that the output signal from the 4-sector detector generates a focus-error signal according to I=(I1+I2)−(I3+I4), where I1 and I2 are values of light intensity from splitter 314 and I3,I4 are from splitter 315. When in-focus, I=0.

When the lens 319 is moved in the lamination direction of the memory card 310, the value of I output from the 4-sector detector changes in such a way that as the focusing position approaches the front surface 311F, the magnitude of the signal I decreases, and as it approached closer, the intensity increases and when the focusing position coincides with the front surface 311F, the signal I becomes 0. When the focusing position is moved deeper into the lamination by moving the converging lens 319, I increases, but further move will decrease I. Therefore, by utilizing the position where I=0, the front surface 311F of the hologram section 311 can be identified.

Figure 15B:
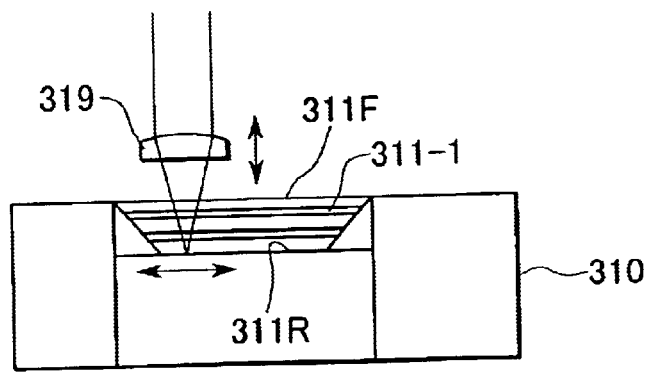

Similarly, the rear surface 311R of the hologram section 311 can be identified, as shown in FIG. 15B. Designating the front surface position by d0 and the rear surface position by dm (m=n+1, where n is the number of waveguide layers), and designating the spacing between the layers by d1, the position of any waveguide 311-x in the lamination 311-1~311-4 can be obtained from a relation:

$$d(x) = d1 + (dm - d0)(x-1)/(n+1) \quad (1).$$

Figure 16:
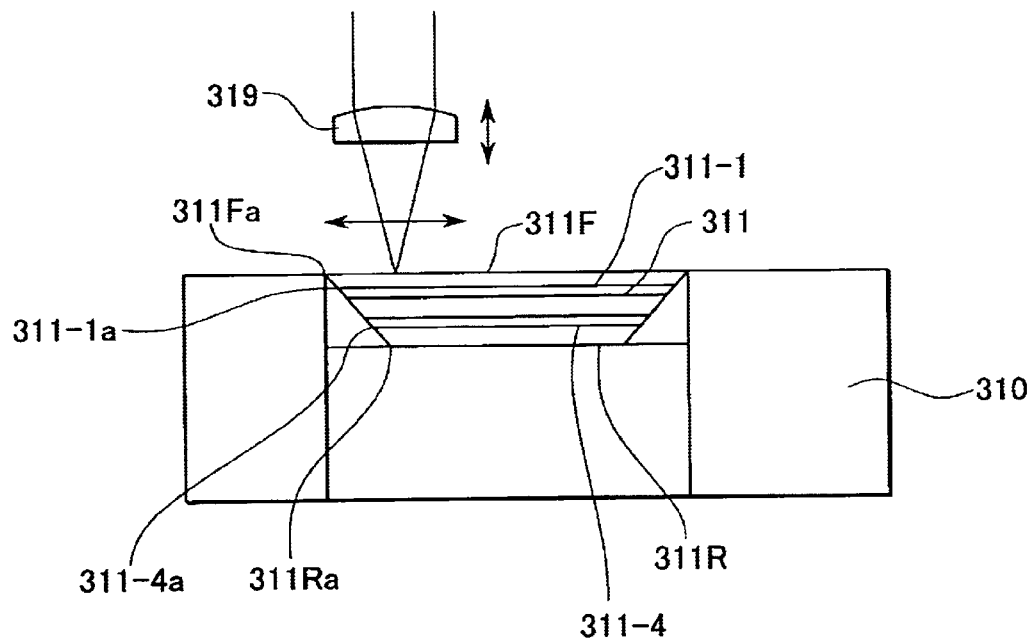
FIG. 16 is a cross sectional view of a method for detecting edges of the front and rear layers of the laminated card medium.

Method 1 for finding the position of a slant surface for horizontal input light FIG. 16 illustrates a method for finding a position for reflecting a beam at a slant surface into a waveguide in the horizontal direction. In FIG. 16, when the focused beam on the front surface 311F is moved to the left, the focal position approaches the front edge surface 311Fa of the front surface 311F. Because there is no recording layer beyond the front edge surface 311Fa, the reflectivity changes, and the change is detected by means of the edge detection circuit 318 shown in FIG. 15A. It is preferable that the edge detector 318 be a 2-sector detector, and the differential signal from the 2-sector detector identifies the edge, at which point the output signal is at a maximum. If a detector with no division is used, the edge 311Fa can be identified as a mid-point value between the extreme detector values obtained when the focal point is on the core and not on the core.

Similarly, the rear edge surface 311Ra of the rear surface 311R can be identified. Then, using the values of the front edge surface 311Fa and rear edge surface 311Ra, the respective positions of the slant surfaces 311-1a~311-4a can be identified by calculation.

The positions of the waveguides 311-1~311-4 and the slant surfaces 311-1a~311-4a are entered in the information for the waveguides so that the position of the lens 319 can be adjusted according to the information provided for focusing the beam exactly at any of the slant surfaces 311-1a~311-4a, thereby enabling the laser beam to be injected accurately into respective waveguides 311-a~311-4. The performance of the memory card 310 is assured by the fact the information stored in the laminated structure can thus be extracted accurately.

Method 2 for Finding a Light Injection Position

Figure 17:
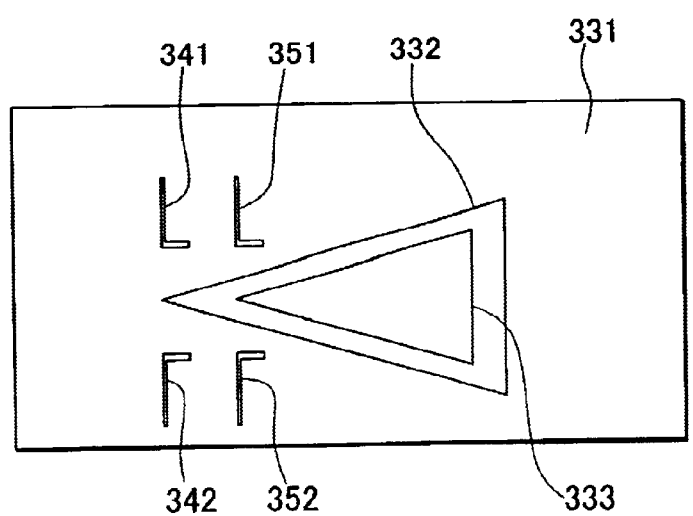
FIG. 17 is a plan view of an example of locator patterns for detecting light injection positions on the front and rear layers of the laminated card medium.

FIG. 17 illustrates another method for finding a position for a slant surface for inputting a beam into a waveguide in the horizontal direction. For simplicity, only the front layer 332 and rear layer 333 are shown. A memory card 331 has locator patterns 341, 342 as light injection position indicating marks for the front layer 332, and locator patterns 351, 352 as light injection position indicating marks for the rear layer 333.

The locator patterns 341, 342 are coplanar with the front layer 332 of the hologram section 311 while the locator patterns 351, 352 are coplanar with the rear layer 333 of the hologram 310. The locator patterns 341, 342, 351, 352 are made of a material that increases or decreases the reflectivity (a material acting as a phase inverter may also be used).

To find the edge position in the memory card 310, the front layer 331 is scanned with the focused laser beam to find the change in the reflectivity associated with the locator patterns 341, 342. After locating the two locator patterns 341, 342, the edge position is derived as the mid-point between the locator pattern positions on the layer 332. Similarly, the rear layer 333 is scanned with the focused laser beam to find the change in the reflectivity associated with the locator patterns 351, 352. After locating the two locator patterns 351, 352, the edge position is derived as the mid-point between the locator pattern positions on the layer 333.

The positions for inputting light to each layer can be calculated based on the edge positions corresponding to the front and rear layers. Designating the light injection position A1 (x, y, z) for the front layer 332, the light injection position An (x, y, z) for the rear layer, and a number of layers n, then the light injection position for any waveguide X may be obtained from a relation:

$$AX\ (x,y,z) = A1\ (x,y,z)(n-X)/(n-1) + An(x,y,z)(X)/(n-1) \quad (2).$$

It is preferable that the shape of the locator patterns 341, 342, 351, 352 be an L-shape, as shown in FIG. 17, showing a junction point between longitudinal and transverse lines.

Shape and size of the locator patterns may be varied for each layer or different codes may be used to facilitate identification of layers.

Such an approach of recording different patterns for identifying light injection position would enable to identify different layers of the memory card quickly and precisely in three-dimensions.

Figure 18:
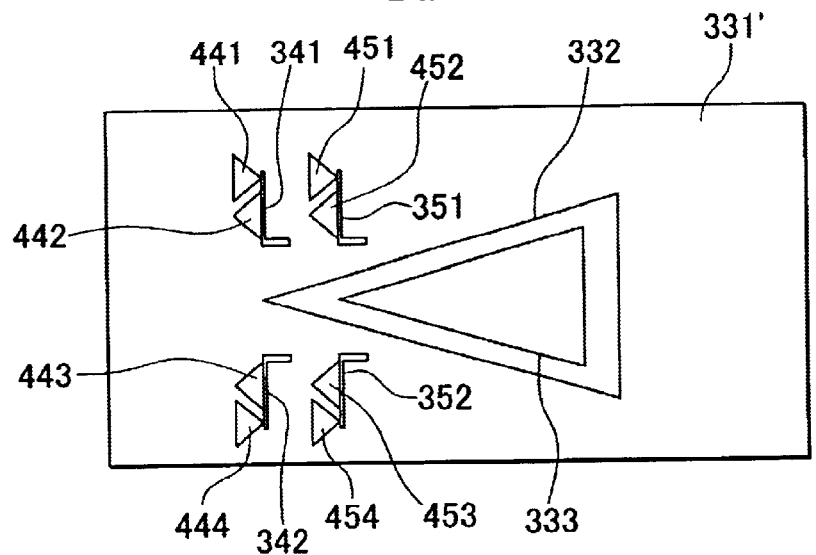
FIG. 18 is a plan view of an example of the locator patterns for detecting light injection positions on the front and rear layers of a slant cut laminated card medium.

FIG. 18 shows a method of aiding the fabrication of lateral slanted surfaces on the memory card at a precise angle of 45 degrees. Fabrication is aided greatly by having some indicator of the angle of cut being made. For this purpose, a pair of confirmation patterns 441, 442 is added to the locator pattern 341, and a pair of the same 443, 444 to the locator pattern 342, a pair of the same 451, 452 to the locator pattern 351, and a pair of the same 453, 454 to the locator pattern 352, as illustrated in FIG. 18.

Each pair is made up of a set of inverted triangle patterns relative to the other so as to form a rectangular shape. The separation distance of the triangles are the same for all the pairs, and all the triangles have the same size.

Therefore, when a lateral surface of the hologram section 311 is being machined at an angle of 45 degrees, and although the cladding and other core layers are being omitted from the drawing, the end portions of all the cladding and core layers in each waveguide should be cut at the same angle. When the cross sectional lengths of the confirmation patterns 441, 442 for example are compared, they should be changing in opposite directions for this layer to be cut at the same angle. The length of the pattern 441 becomes shorter while the length of the pattern 442 becomes longer as more material is removed by cutting from the outer surface. The angle of cut will be the same for all the edges on the slant surface when the relative ratios of the lengths of the pair of marks (441/442, 443/444, 451/452, 453/454) are all about the same.

Therefore, by providing the confirmation marks 441~444 and 451~454 for the front and the rear layers 332, 333, the lateral surfaces of the hologram section 311 can be fabricated exactly at 45 degrees to improve the performance of the memory card.

In FIGS. 17, 18, the planar shape of the front and the rear layers 332, 333, (planar shape of the waveguides) is a wedge shape (or fan-shape, refer to FIG. 21B), but a narrow rectangular shape may be adopted. Fan shape is preferable because the refracted laser light diverges as it propagates along the recording layer.

Method of Changing the Focal Position

Method 1

In FIG. 15, the objective lens 319 was moved vertically to change the focal position from the front surface 311F to the rear surface 311R of the hologram section 311.

Figure 19A:
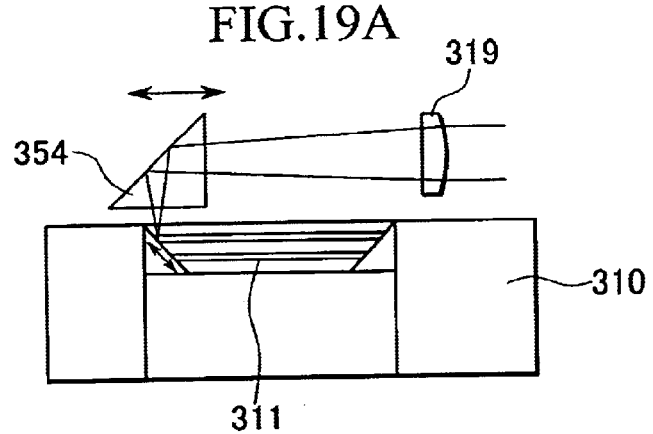
FIGS. 19A, 19B are cross sectional views of examples of light injection into the laminated hologram section of the card medium.

FIG. 19A shows another method of changing the focal position by moving a prism 354 which is provided to operate with the objective lens 319. The principle of the operation is explained with reference to FIG. 19A, where a beam parallel to the surface of the memory card 310 is redirected by the prism 354 to focus on the slant surface, but in practice, input beam is injected at right angles to the surface of the memory card 310. And, a plurality of prisms are inserted between the lens 319 and the memory card 310.

In the example shown in FIG. 19A, the focal position is altered by moving the prism 354 to left/right directions. When the prism 354 is moved to the left, the focal position moves up, and when it is moved to the right, the focal position moves down. Vertical as well as horizontal movement of the focal position can be controlled by moving the prism 354.

The lens 319 can be moved simultaneously in the opposite direction to the movement of the prism 354, in a range of $0.1 \times (NS-1) \times \Delta d$ to $2 \times (NS-1) \times \Delta d$, where NS is the refractive index of the hologram section 311 and $\Delta d$ is the distance of movement of the prism 354. Most preferable is a range of $0.9 \times (NS-1) \times \Delta d$ to $1.1 \times (NS-1) \times \Delta d$.

Method 2

Figure 19B:
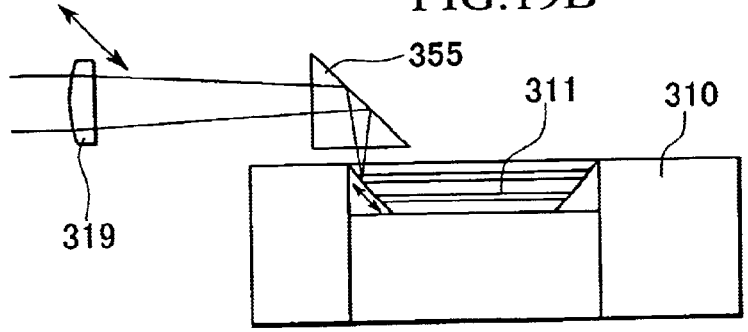

FIG. 19B illustrates another method of changing the focal position. In this method, the lens 319 is moved at an angle to the surface of the memory card 310 as indicated by double ended arrow. When the lens 319 is moved in the upper left direction, the focal position moves up, and when the lens 319 is moved in the lower right direction, the focal position moves down. Vertical as well as horizontal movement of the focal position can be controlled by moving the lens 319.

The lens 319 and the prism 355 can be moved simultaneously in the opposite direction, in a range of $0.1 \times (NS-1) \times \Delta d$ to $2 \times (NS-1) \times \Delta d$, where NS is the refractive index of the recording layer 311-x and $\Delta d$ is the distance of movement of the prism 354. Most preferable is a range of $0.9 \times (NS-1) \times \Delta d$ to $1.1 \times (NS-1) \times \Delta d$.

By adopting the method of changing the focal position illustrated in FIGS. 19A, 19B, it is possible to make the information reading apparatus more compact and simplify the mechanism for reproducing the holographic information.

Examples of Information Reproduction Mechanism

Figure 20A:
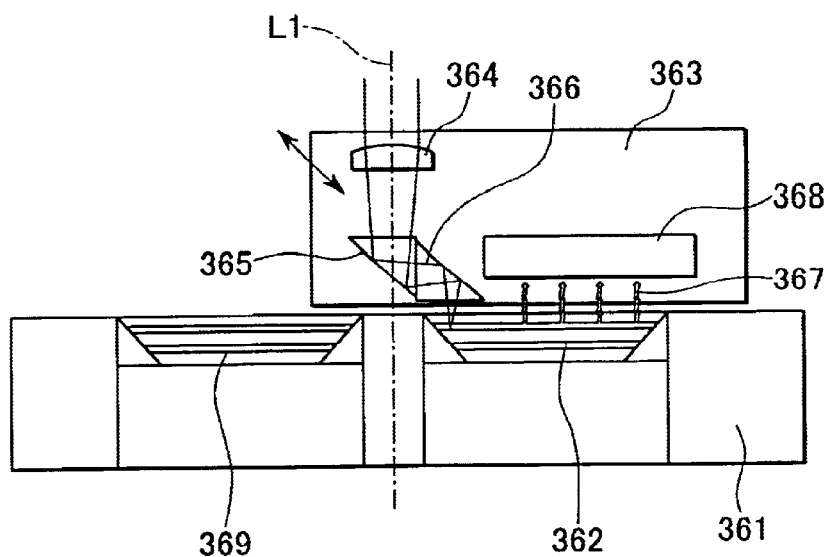
FIGS. 20A–20C are cross sectional views of an example of selective hologram image reproduction apparatus.
Figure 20B:
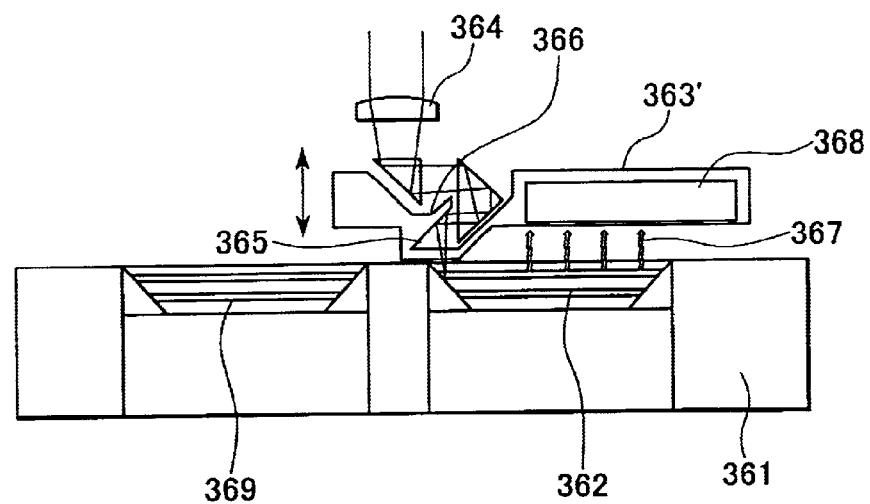
Figure 20C:
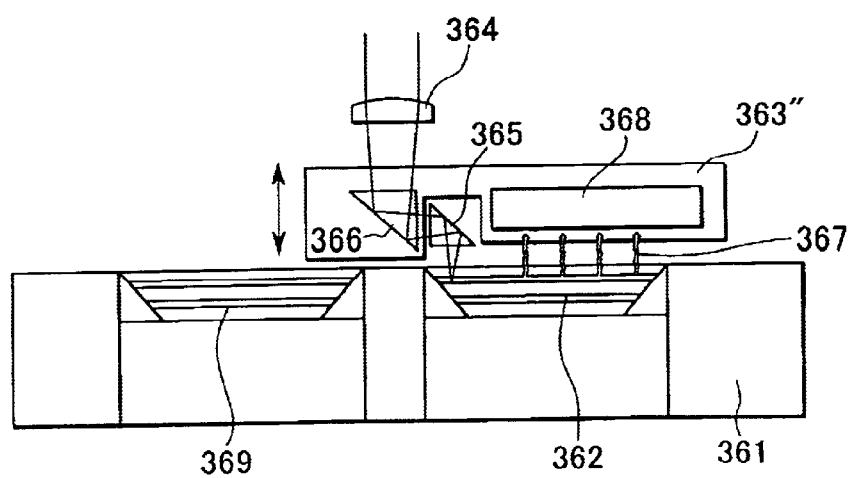

FIGS. 20A~20C show some examples of data reproduction configuration. In the configuration shown in FIG. 20A, a reproduction device 363 reproduces the information recorded in the laminated recording layer 362 formed on a base 361. A laser source for imaging is provided external to the apparatus in this example, but it may be incorporated within the apparatus.

A laser beam is injected into a desired recording layer in the lamination 362 through a converging lens 364, a prism 365 and a prism 366. Information is recorded as bumps and dents in each layer of the lamination 362, and the light propagating in the layer is scattered out by these irregularities to the front and rear surfaces. The scattered beams are detected by a detector 368. The detector 368 is preferably a planar photo-detector such as CCD. The hologram is recorded in a digital form as bumps and dents in each layer of the lamination 362 so as to represent data on the surface of the detector 368. Such digital data can be reproduced as an image on the detector 368 by placing a suitable lens system in front of the detector 368.

Access to a desired layer may be achieved by controlling the movement of the converging lens 364. Movement of the lens 364 to upper left causes the focal position to move up, and movement to lower right causes the focal position to move down. Vertical as well as lateral movements are controlled.

As before, a prism 365 and a lens 364 can be simultaneously moved vertically, as illustrated in FIG. 20B, to access a desired layer. A preferable range of movement of the lens 364 is $0.1 \times (NS-1) \times \Delta d$ to $2 \times (NS-1) \times \Delta d$, where NS is the refractive index of the recording layer 311-x and $\Delta d$ is the distance of movement of the prism 354. Most preferable is a range of $0.9 \times (NS-1) \times \Delta d$ to $1.1 \times (NS-1) \times \Delta d$.

Another method of accessing a desired layer is illustrated in FIG. 20C, in which both the prism 366 and the lens 364 are moved simultaneously in the opposite directions. A preferable range of movement of the lens 364 is $0.1 \times (NS-1) \times \Delta d$ to $2 \times (NS-1) \times \Delta d$, where NS is the refractive index of the recording layer 311-x and $\Delta d$ is the distance of movement of the prism 354. Most preferable is a range of $0.9 \times (NS-1) \times \Delta d$ to $1.1 \times (NS-1) \times \Delta d$.

It can be seen in FIG. 20C that the lamination 369 is provided as a pair with the lamination 362, and they are placed in symmetry with respect to the center of the memory card 310. It should be noted that more than two laminations may be provided for the memory card 310. In such a case, a plurality of laminations may be arranged in a petal pattern about the central axis L1 of the memory card 310. In the configuration shown in FIG. 20A, information from the laminations 362, 369 is read by rotating the reproduction device 363 or the base 361 about the central axis L1.

In the configuration shown in FIG. 20B, the prism 365 and the detector 369 provided in the reproduction device 363 are moved simultaneously to maintain the distance between each layer in the lamination 362 to the detector 368 constant to reproduce the data under a stable condition.

The configurations shown in FIGS. 20A~20C enable to align both vertical and lateral positions of the input light into the laminations 362, 369 using a relatively simple structure.

Figure 21A:
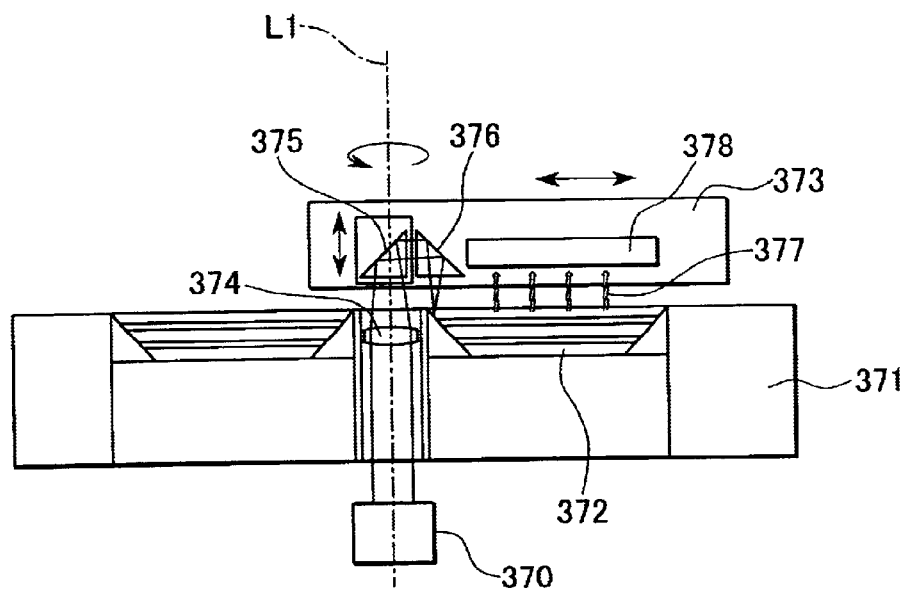
FIGS. 21A, 21B are, respectively, a cross sectional view and a perspective view of a selective hologram image reproduction apparatus.
Figure 21B:
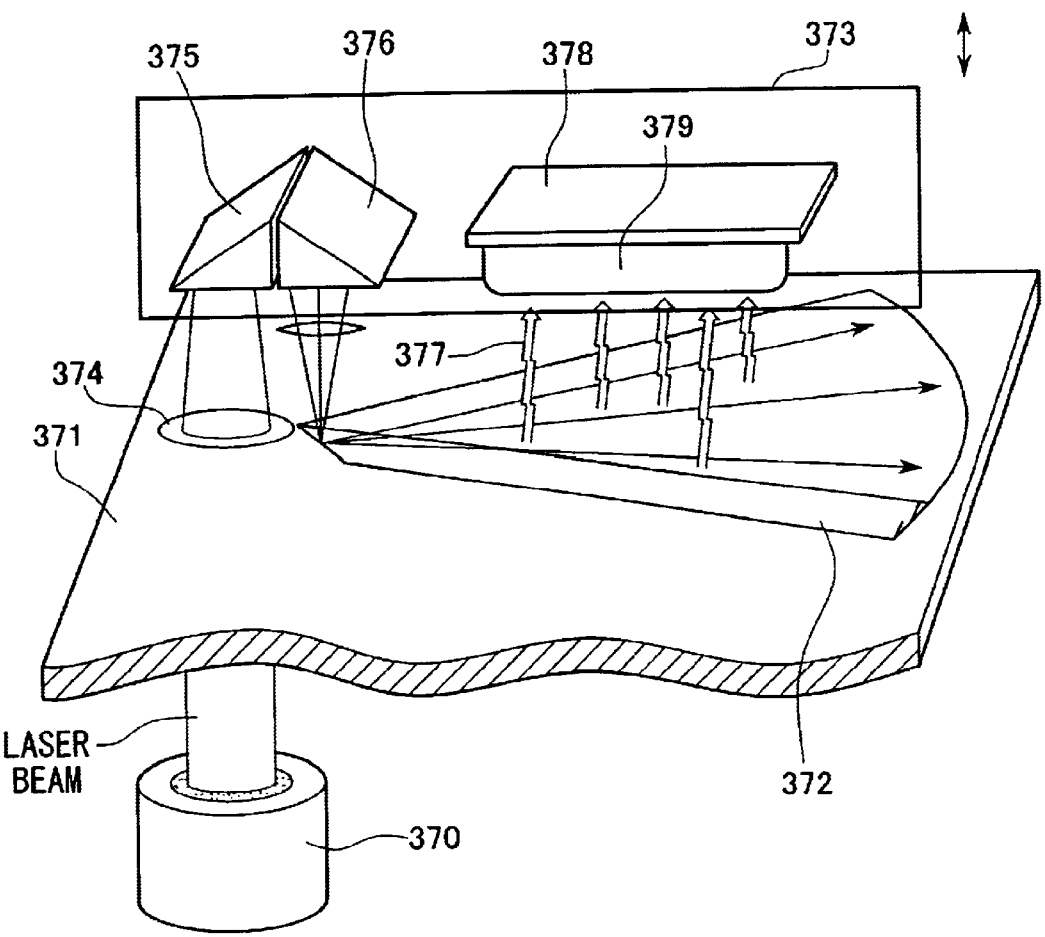

FIGS. 21A, 21B show another configuration of the information reproduction apparatus, where FIG. 21A is a cross sectional view and FIG. 21B is a perspective view of the apparatus. In this apparatus, the converging lens 374 is provided in the base 371 for reproducing information stored in a pair of laminations 372, and the illumination laser source 370 is located below the base 371.

The beam emitted from the laser source 370 passes through the converging lens 374 into a prism 375, prism 376 and enters the layer, in the lamination 372, containing the information to be reproduced. Information is recorded as bumps and dents on the surface of each recording layer in the lamination 372, and the light scattered to the front and rear surface is detected by the detector 378, which is ideally realized by CCD. The hologram is recorded in a digital form as bumps and dents in each layer of the lamination 372 so as to represent data on the surface of the detector 378. Such digital data can be reproduced as an image on the detector 378 by placing a suitable lens system 379 in front of the detector 378. Such a lens 379 may be realized by a normal convex lens or holographic lens, or an assembly of cylindrical lens.

Access control for each layer of the lamination 372 can be achieved by moving the prism 375 vertically. Prism 376 and the detector 378 may be moved as a unit to further improve the focusing properties. The prism 376 and others can be moved, in a range of 0.1×(NS−1)×Δd to 2×(NS−1)×Δd, where NS is the refractive index of the recording layer 372 and Δd is the distance of movement of the prism 375. Most preferable is a range of 0.9×(NS−1)×Δd to 1.1×(NS−1)×Δd. Because the converging lens 374 is incorporated in the base 371 in this apparatus, the reference for spot positioning can be obtained with the use of the converging lens 374.

Therefore, positioning process of the reproduction device 373 is simplified, and high precision data reproduction can be achieved by rotating the reproduction device 373 or the base 371 about the central axis L1.

Figure 22A:
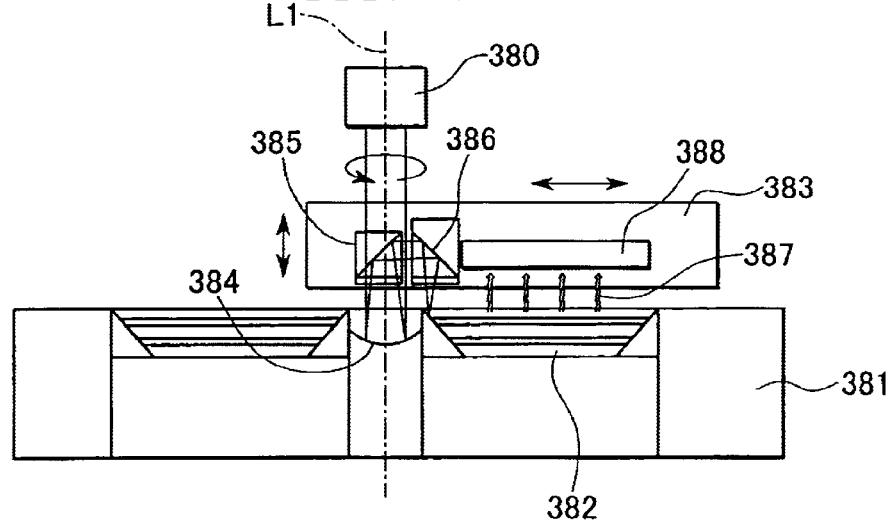
FIGS. 22A, 22B are, respectively, a cross sectional view and a perspective view of another selective hologram image production apparatus.
Figure 22B:
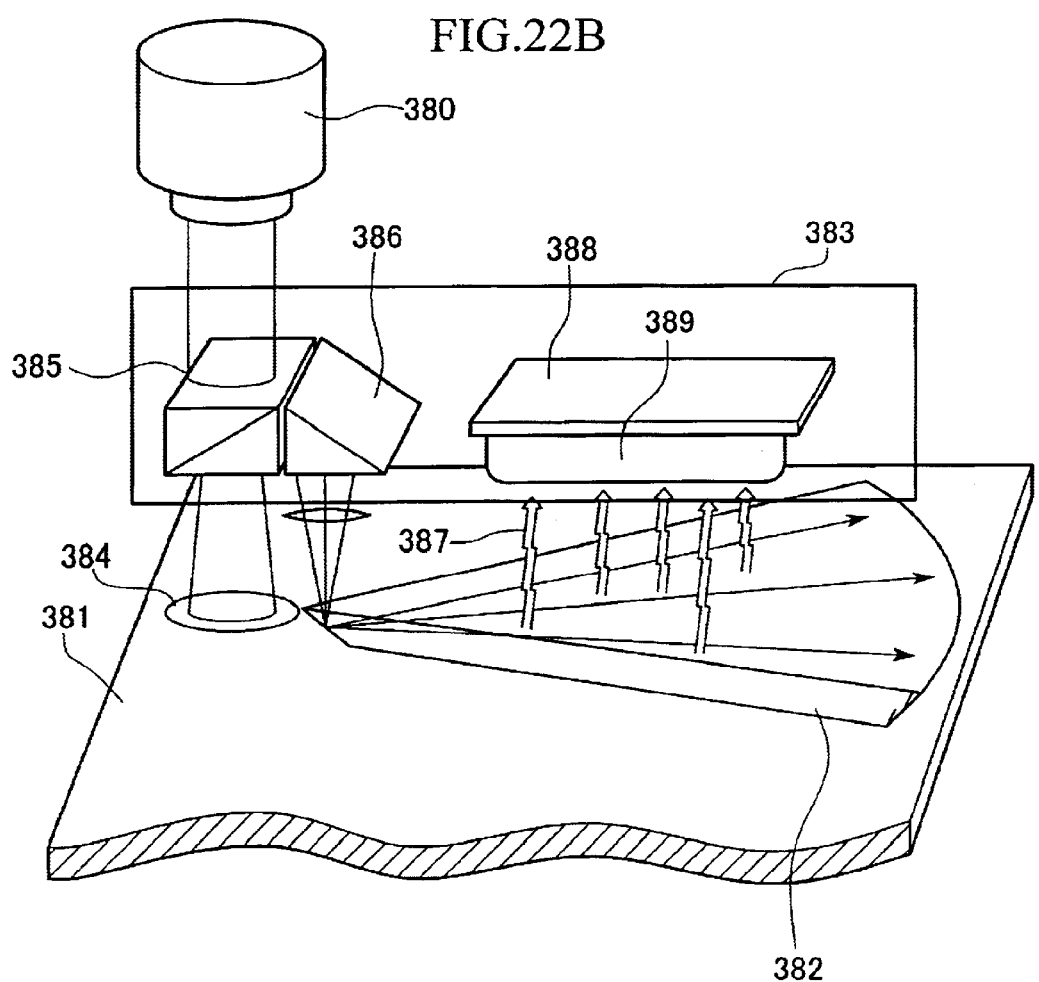
Figure 23:
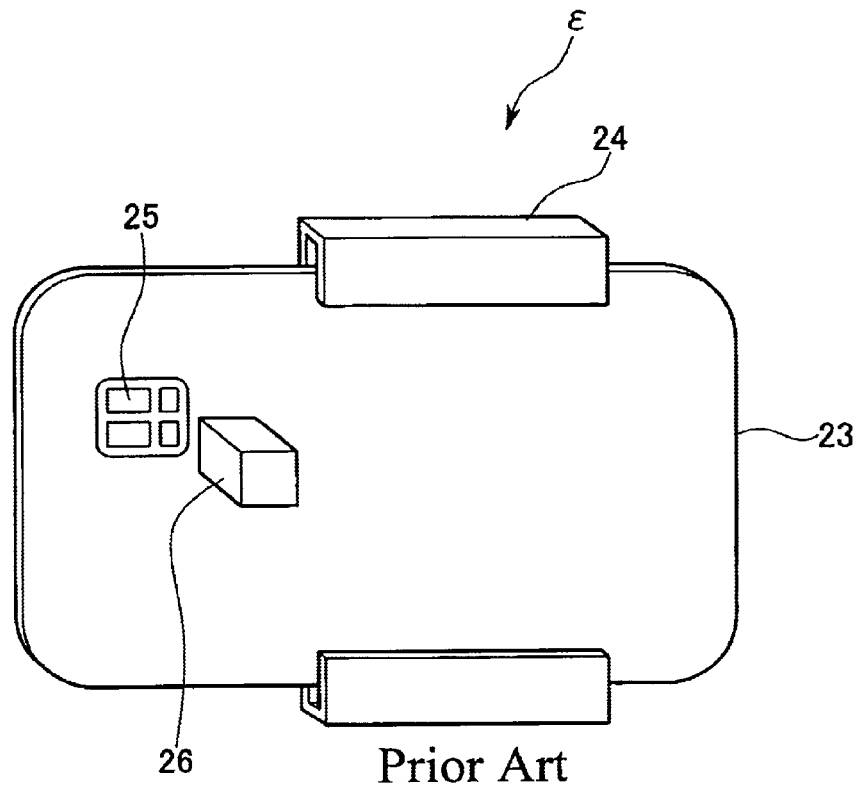
FIG. 23 is a perspective view of a conventional IC card.
Figure 24:
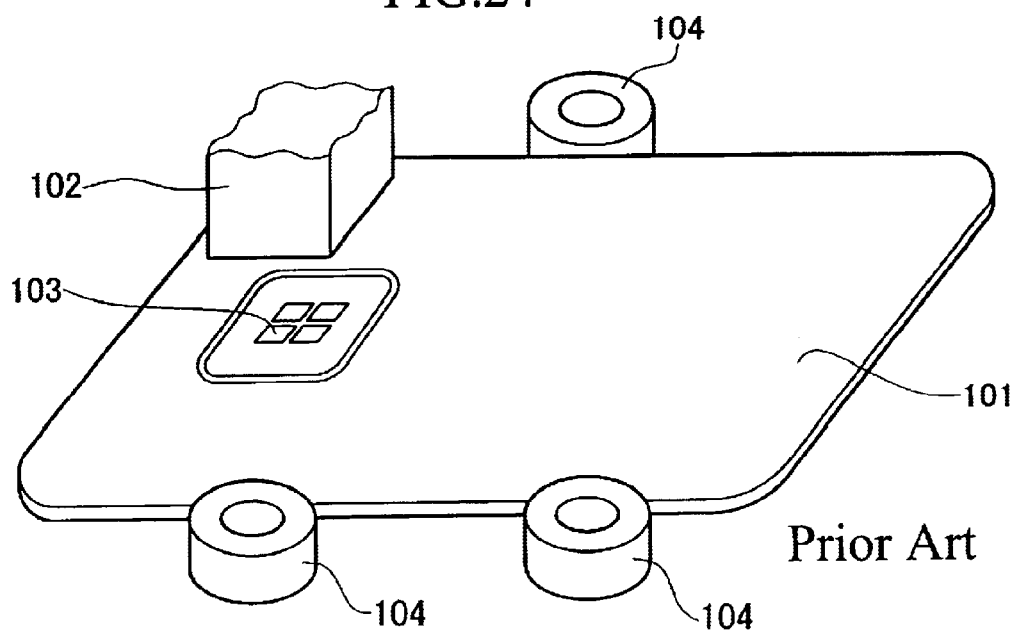
FIG. 24 is a perspective view of another conventional IC card.
Figure 25:
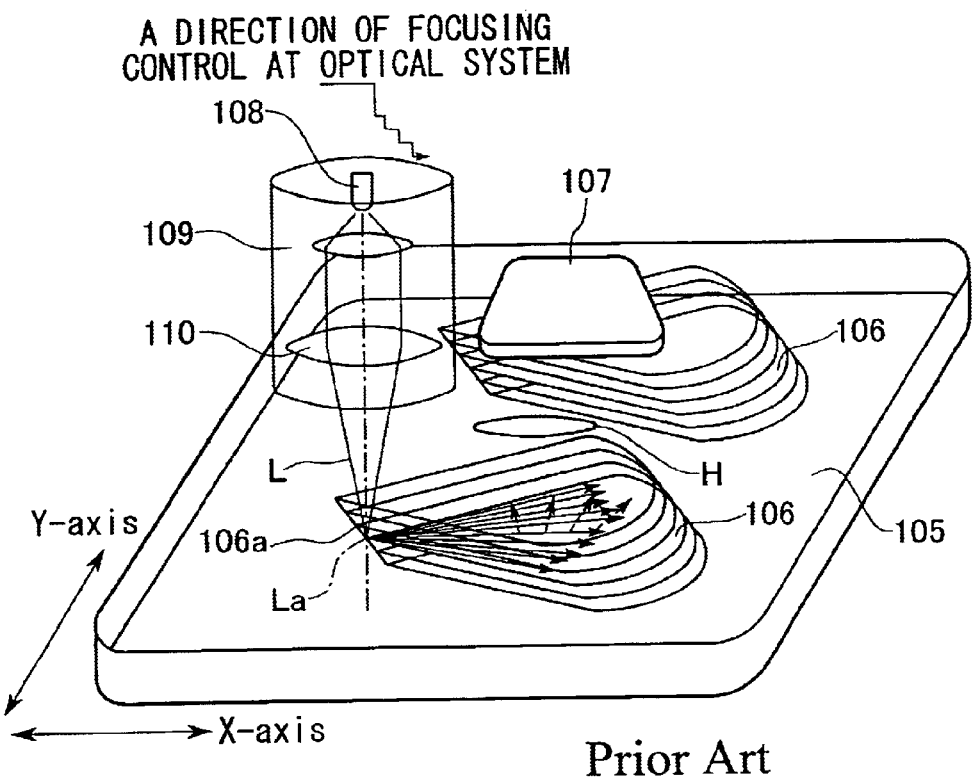
FIG. 25 is a perspective view of a conventional multi-layered hologram storage card and a hologram reader.
Figure 26:
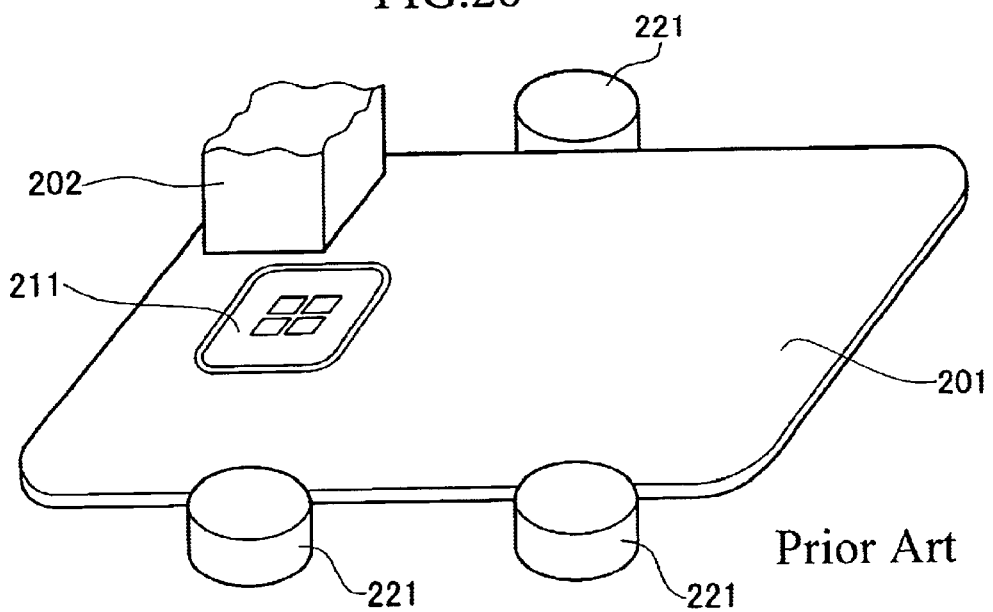
FIG. 26 is another example of the conventional IC card.
Figure 27:
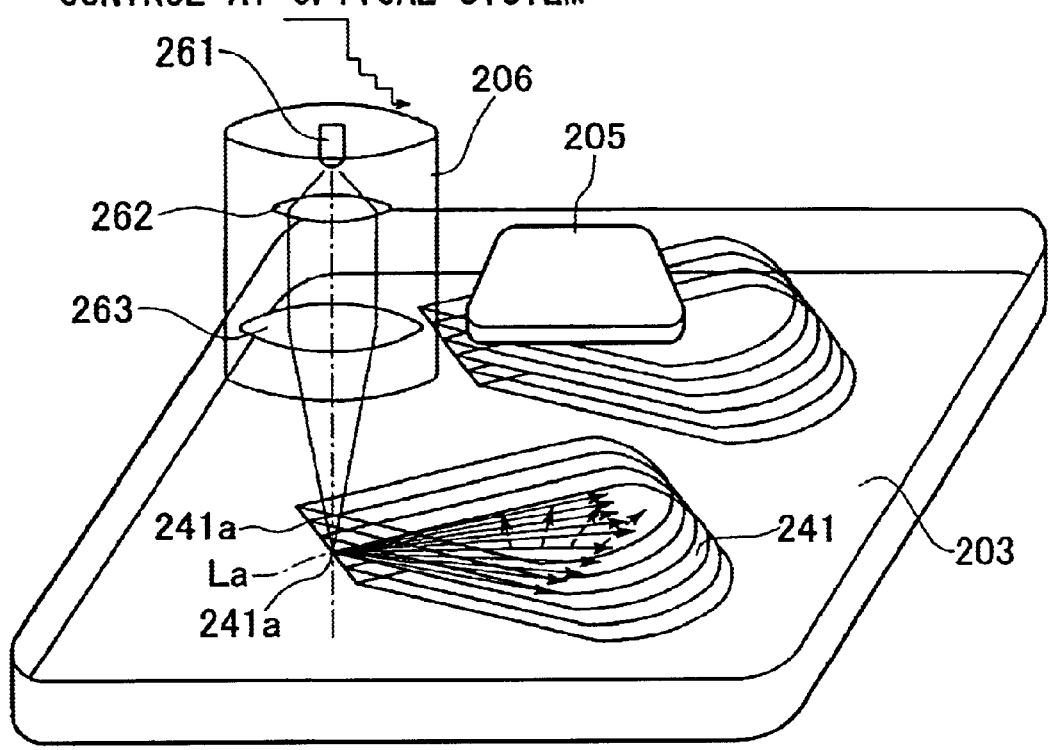
FIG. 27 is a perspective view of another conventional multi-layered hologram storage card and a hologram reader.

FIG. 22 shows another configuration of the information reproduction device. FIG. 22A shows a cross sectional view and FIG. 22B is a perspective view. In this apparatus, a focusing reflection plate 384 is provided in the base 381 for reproducing information stored in the lamination 381. The laser source 380 is provided above the base 381.

A beam emitted from the laser source 380 is reflected by the reflection plate 384 and redirected by the prism 385, and is directed by the prism 386 to enter a desired layer in the lamination 382. Information is recorded as bumps and dents on the surface of each recording layer in the lamination 382, and the light scattered to the front and rear surface is detected by the detector 388, which is ideally realized by CCD.

The hologram is recorded in a digital form as bumps and dents in each layer of the lamination 382 so as to represent data on the surface of the detector 388. Such digital data can be reproduced as an image on the detector 388 by placing a suitable lens system 389 in front of the detector 388. Such a lens 389 may be realized by a normal convex lens or holographic lens, or an assembly of cylindrical lens.

Access control for each layer of the lamination 382 can be achieved by moving the prism 385 vertically. Movement of the prism 386 may be controlled to further improve the focusing properties. The prism 386 can be moved, in a range of 0.1×(NS−1)×Δd to 2×(NS−1)×Δd, where NS is the refractive index of the recording layer 382 and Δd is the distance of movement of the prism 385. Most preferable is a range of 0.9×(NS−1)×Δd to 1.1×(NS−1)×Δd. Because the focusing reflection plate 384 is incorporated in the base 381 in this apparatus, high precision data reproduction can be achieved by rotating the reproduction device 383 or the base 381 about the central axis L1. The reflection plate 384 may be made of a hologram.

It should be noted that although the present invention was exemplified in various specific embodiments, the scope of the present invention is not limited by these specific examples. It is obvious that various modifications are possible within the principle of the present invention that laminated holograms, serving as an ultra-high capacity information storage, can be produced in a simple apparatus to achieve a precise coupling of input light with a selected input point to a waveguide.

We claim:

1. An apparatus for reading data in an information recording medium containing a plurality of lamination recording sections arranged longitudinally and separated by a plurality of longitudinally extending head seek grooves, said apparatus comprising:

an illumination head device having a light output section shaped to freely couple or decouple from a head alignment groove formed at a light input section of each of said lamination recording sections, and to freely slide in a thickness direction of said information recording medium when being coupled with said head alignment groove for aligning with a recording layer; and an image data recording device having an imaging element for recording a floating image formed in a space above said information recording medium generated by output light emitted from said illumination head device interacting with a lamination recording section.

2. An apparatus according to claim 1, wherein said light output section of said illumination head is v-shape in a plan view of said information recording medium.

3. An apparatus according to claim 1, wherein said imaging element is integrally joined to an elevator actuator for focusing in a direction at right angles to said information recording medium through an elevator support.

4. An apparatus according to claim 3, wherein said illumination head and said imaging element are provided with respective elevator actuators operatively connected so as to freely receive control signals: from a photo-detector element disposed in opposition to an optical element connected through said illumination head and an optical path, and disposed in said optical path in such way to monitor optical power of reflected return light returning from said lamination recording section; and from an optical means for judging optical power levels according to a pre-determined threshold value and obtaining a total count of traverses made by power levels across said threshold value.

5. An apparatus according to claim 3, said illumination head and said imaging element are provided with respective elevator actuators operatively connected so as to freely receive control signals: from a photo-detector disposed in lateral proximity to said imaging element for detecting optical power of a floating informational image generated by said information recording medium; and from an optical means for judging optical power levels according to a pre-determined threshold value and obtaining a total count of traverses made by power levels across said threshold value.

6. An apparatus for reading information recorded on a target waveguide by injecting an input light into a lamination recording section comprised by a plurality of waveguides serving as information recording layers in an information recording medium comprising:

an extreme layer detection device for determining positions of a front waveguide and a rear waveguide in said lamination recording section;

a layer edge detection device for determining positions of a front waveguide edge and a rear waveguide edge; and a layer position determining device for determining positions of each waveguide and a slanted surface associated with each waveguide edge, according to positions of said front waveguide and said rear waveguide obtained by said extreme layer detection device and positions of said front waveguide edge and said rear waveguide edge obtained by said layer edge detection device.

7. An apparatus according to claim 6, wherein said apparatus is provided with a focusing device for focusing said input light on a light injection window determined according to positions of a target waveguide in said lamination recording section and a slanted edge associated with said target waveguide.

8. An apparatus according to claim 7, wherein said focusing device focuses light by positioning a focusing lens.

9. An apparatus according to claim 7, wherein said focusing device focuses light by positioning a prism.

10. An apparatus according to claim 7, wherein said focusing device focuses light by positioning a focusing lens and a prism.

11. An information recording medium structured as a card medium having card framing to contain not less than one longitudinally extending lamination recording section comprised by planar waveguide type information recording layers laminated in a thickness direction of said card medium, and a row of head alignment grooves having respective light injection windows separated by a head seek groove extending longitudinally so as to permit an illumination head to freely travel in said head seek groove to couple with a desired light injection window.

12. An information recording medium according to claim 11, wherein said head alignment groove is v-shaped.

13. An information recording medium according to claim 11, wherein said card framing is provided with head positioning markers to indicate positions of said light injection windows or said head alignment grooves.

14. An information recording medium comprising a data storage disc section having recording sections comprised by a lamination of recording layers distributed in a ring arrangement and a support section for supporting said data storage disc section at its periphery.

15. An information recording medium according to claim 14, wherein said support section is provided with a rotation mechanism.

16. An information recording medium according to claim 14, wherein said data storage disc section comprises a column of light injection windows arranged in parallel to a central axis of said disc for injecting light into said recording layers, and a lamination of opposing marker layers surrounding said column of light injection windows.

17. An information recording medium according to claim 16, wherein said marker layers are arranged in a different interlayer spacing than an interlayer spacing of recording layers in a wedge-shaped recording section.

18. An information recording medium according to claim 16, wherein said data storage disc section is provided with a position information recording layer containing position information for focusing input light on a light injection window.

19. An information recording medium according to claim 16, wherein said data storage disc section is comprised by a plurality of discs.

20. A method for aligning an illumination head for reading information recorded in a laminated information recording medium, having a plurality of data recording layers laminated in a thickness direction of said card medium, comprised by a plurality of lamination recording sections arranged in a longitudinal direction, wherein each lamination recording section has a head alignment groove at a transverse end for coupling with an illumination head having light injection windows for aligning said illumination head with a specific recording layer by sliding in a card thickness direction within said head alignment groove, and rows of lamination recording sections are separated by longitudinal head seek grooves; said method comprising the steps of:

detecting head positioning markers provided on a longitudinal frame of said card medium to correspond to head alignment grooves;

decoupling an illumination head from a head alignment groove and placing in a standby position, and moving said illumination head along a head seek groove to oppose a selected head positioning marker for preliminary head positioning;

positioning said illumination head to a top or bottom window position within said head alignment groove, and coupling to said head alignment groove in a vertical position;

performing rough positioning of said illumination head so that input light is roughly in line with a target light injection window; and performing precision positioning of said illumination head so that input light is precisely aligned with said target light injection window.

21. A method for reading data, recorded in laminated information recording medium having a plurality of waveguides as information recording layers, comprising the steps of:

detecting positions of a front waveguide and a rear waveguide as well as input edges associated with each waveguide;

determining positions of each waveguide as well as said input edges according to positions of said front waveguide and said rear waveguide as well as slanted edge surfaces associated with said input edges; and focusing light on an input light position determined by a position of a target waveguide and a position of a slanted edge surface associated with said target waveguide so as to read data contained in said target waveguide included in said plurality of waveguides.

* * * * *